United States Patent
Ker et al.

(10) Patent No.: US 6,671,153 B1
(45) Date of Patent: Dec. 30, 2003

(54) LOW-LEAKAGE DIODE STRING FOR USE IN THE POWER-RAIL ESD CLAMP CIRCUITS

(75) Inventors: Ming-Dou Ker, Hsinchu (TW); Wen-Yu Lo, Tung-Chih (TW); Hun-Hsien Chang, Hsichih (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 299 days.

(21) Appl. No.: 09/659,788

(22) Filed: Sep. 11, 2000

(51) Int. Cl.[7] .................................................. A02H 3/22
(52) U.S. Cl. ......................................... 361/111; 361/56
(58) Field of Search .................................... 361/111, 56

(56) References Cited

U.S. PATENT DOCUMENTS

| | | | |
|---|---|---|---|
| 5,528,188 A | 6/1996 | Au et al. ..................... | 327/310 |
| 5,530,612 A | 6/1996 | Maloney ...................... | 361/56 |
| 5,572,394 A | 11/1996 | Ker et al. .................... | 361/56 |
| 5,740,000 A | 4/1998 | Stackhouse et al. .......... | 361/56 |
| 5,754,381 A | 5/1998 | Ker .............................. | 361/56 |
| 5,886,862 A | 3/1999 | Anderson et al. ............. | 361/56 |
| 5,907,464 A | 5/1999 | Maloney et al. ............. | 361/111 |
| 5,917,336 A | 6/1999 | Smith et al. .................. | 326/30 |
| 5,945,713 A | 8/1999 | Voldman ..................... | 257/355 |
| 5,959,820 A | 9/1999 | Ker et al. .................... | 361/56 |
| 6,002,568 A | 12/1999 | Ker et al. .................... | 361/111 |
| 6,008,684 A | 12/1999 | Ker et al. .................... | 327/428 |
| 6,011,681 A | 1/2000 | Ker et al. .................... | 361/111 |
| 6,043,539 A * | 3/2000 | Sugasawara ................ | 361/111 |

OTHER PUBLICATIONS

C. Duvvury et al., "Internal Chip ESD Phenomena Beyond the Protection Circuit," IEEE Trans. on Electron Devices, vol. 35, pp. 2133–2139 (1988).

C.–N. Wu et al., "Unexpected ESD Damage on Internal Circuits of Sub–um CMOS Technology," Proc. of Int. Electron Devices Materials Symp. pp. 143–146 (1996).

M.–D. Ker et al., "ESD Protection to Overcome Internal Gate–Oxide Damage on Digital–Analog Interface of Mixed– Mode CMOS IC's," Microelectronics Reliability, vol. 36, pp. 1727–1730 (1996).

H. Terletzki et al., "Influence of the Series Resistance of On–Chip Power Supply Buses on Internal Device Failure After ESD Stress," IEEE Trans. on Electron Devices, vol. 40, pp. 2081–2083 (1993).

C. C. Johnson et al., "Two Unusual HBM ESD Failure Mechanisms on a Mature CMOS Process," Proc. of EOS/ESD Sump.(1993), pp. 225–231.

M. Chaine et al., "Unique ESD Failure Mechanisms During Negative to VCC HBM Tests," Proc. of EOS/ESD Symp., pp. 346–355 (1997).

(List continued on next page.)

*Primary Examiner*—Brian Sircus
*Assistant Examiner*—Isabel Rodriguez
(74) *Attorney, Agent, or Firm*—George O. Saile; Stephen B. Ackerman; Graham S. Jones II

(57) ABSTRACT

A diode string with very low leakage current is used in power supply ESD clamp circuits. By adding an CMOS-Controlled Lateral SCR device into the cascaded diode string, the leakage current of this new diode string with 6 cascaded diodes under 5 Volts (3.3 Volts) forward bias can be controlled below 2.1 (1.07) nA at a temperature of 125° C. in a 0.35 μm silicide CMOS process. The holding voltage of this design with the CMOS-Controlled Lateral SCR can be linearly adjusted by changing the number of the cascaded diodes in the diode string for the application among the power lines with different voltage levels. The ESD level of this ESD clamp circuit is greater than 8,000 Volts in the Human-Body-Model ESD test. The diodes string is suitable for portable or low-power CMOS Integrated Circuit (IC) devices.

16 Claims, 28 Drawing Sheets

OTHER PUBLICATIONS

EOS/ESD Standard for ESD Sensitivity Testing, EOS/ESD Association, Inc., New York (1998) (New Version).

C. Cook et al., "Characterization of New Failure Mechanisms Arising From Power–Pin ESD Stressing," Proc. of EOS/ESD Symp., pp. 149–156 (1993).

T. Maloney et al., "Novel Clamp Circuits for IC Power Supply Protection," Proc. of EOS/ESD Symp., pp. 1–12 (1995).

X. Guggenmos et al., "A New ESD Protection Concept for VLSI CMOS Circuits Avoiding Circuit Stress," Proc. of EOS/ESD Symp., pp. 74–82 (1991).

N. Maene et al., "On–Chip Electrostatic Discharge Protection for Inputs, Outputs, and Supplies of CMOS Technology," Proc. of EOS/ESD Symp. pp. 228–233 (1992).

M.–D. Ker et al., "Whole–Chip ESD Protection Scheme for CMOS Mixed–Mode IC's in Deep–Submicron CMOS Technology," Proc. of IEEE Custom Integrated Circuits Conference, pp. 31–34 (1997).

S.H. Voldman et al., "Mixed–Voltage Interface ESD Protection Circuits for Advanced Microprocessors in Shallow Trench and LOCOS Isolation CMOS Technologies", IEDM Tech. Dig., pp. 227–280 (1994).

S. Dabral et al., "Designing On–Chip Power Supply Coupling Diodes for ESD Protection and Noise Immunity," Proc. of EOS/ESD Symp., pp. 239–249 (1993).

W.T. Rhoades, "ESD Stress on IC's in Equipment," EOS/ESD Symp., Proc., EOS–12, pp. 82–91 (1990).

M.–D. Ker, "Whole–Chip ESD Protection Design With Efficient VDD–to–VSS ESD Clamp Circuits for Submicron CMOS, VLSI," IEEE Trans. on Electron Devices, vol. 46, pp. 173–183 (1999).

M.–D. Ker et al., "Whole–Chip ESD Protection for CMOS VLSI/ULSI With Multiple power Pins," Proc. of IEEE International Integrated Reliability Workshop, pp. 124–128 (1994).

A. Chatterjee et al., "A Low–Voltage Triggering SCR for On–Chip ESD Protection at Output and Input Pads," Proc. of Symposium on VLSI Technology, pp. 75–76 (1990).

M.–D. Ker et al., Complementary–LVTSCR ESD Protection Scheme for Submicron CMOS, IC's Proc. of IEEE International Symposium on Circuits and Systems, pp. 833–836 (1995).

Electromagnetic Compatibility for Industrial–Process Measurement and Control Equipment, International Standard IEC 1000–4–2. (1995) (New Version).

J. Maas et al., "Testing Electronic Products for Susceptibility to Electrostatic Discharge," 1990 EOS/ESD Symp., EOS–12, pp. 92–96.

E. Chwastek, "A New Method for Assessing the Susceptibility of CMOS Integrated Circuits to Latch–up: The System–Transient Technique," EOS/ESD Symp. Proc., EOS–11, pp. 149–155 (1989).

R. Lewis et al., "Simulation of a System Level Transient–Induced Latchup Event," EOS/ESD Symp. Proc., EOS–16, pp. 193–199 (1994).

G. Weiss et al., "Transient–Induced Latchup Testing of CMOS Integrated Circuits," EOS/ESD Symp. Proc., EOS–17, pp. 194–198 (1995).

M–D. Ker et al., "Design on the Low–Leakage Diode String for Using the Power Rail ESD Clamp Circuits in a 0.35 um Silicide CMOS Process", IEEE Transactions on Solid State Circuits, vol. 35, No. 4, Apr. 2000.

M. Corsi et al., "ESD Protection of Bi CMOS Integrated Circuits Which Need to Operate in the Harsh Environment of Automotive of Industrial," EOS/ESD Symp. Proc., EOS–15, pp. 209–213 (1993).

* cited by examiner

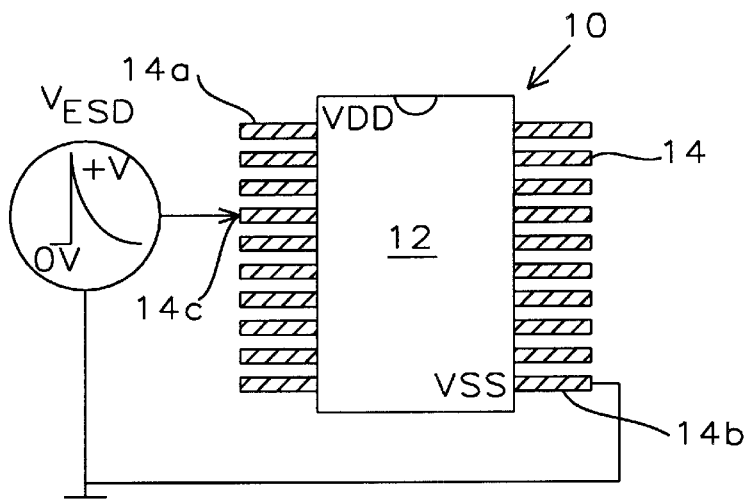
FIG. 1A – Prior Art
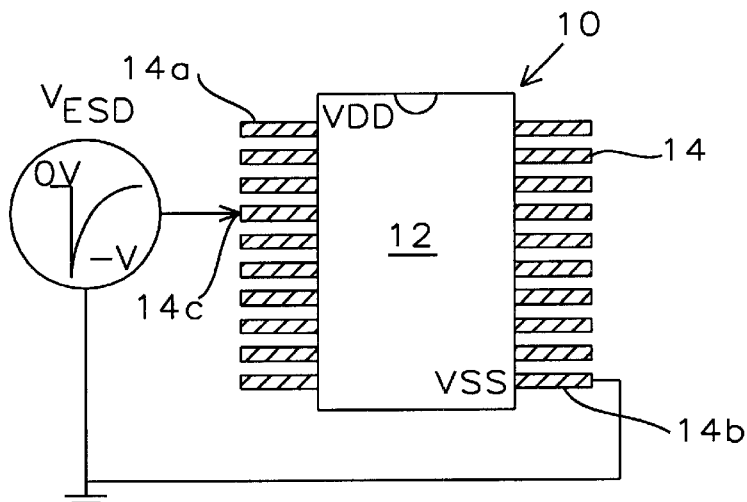
FIG. 1B – Prior Art
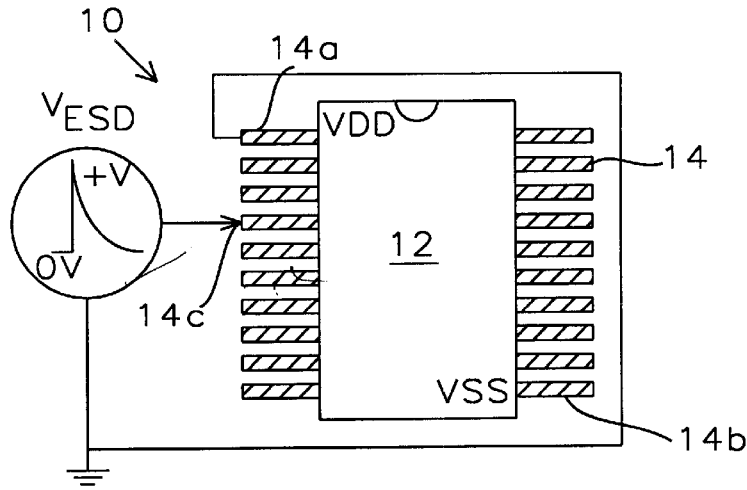
FIG. 1C – Prior Art

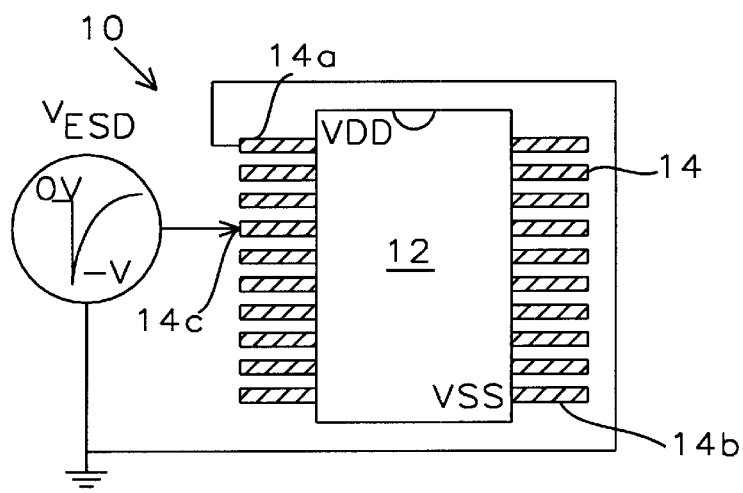
FIG. 1D- Prior Art
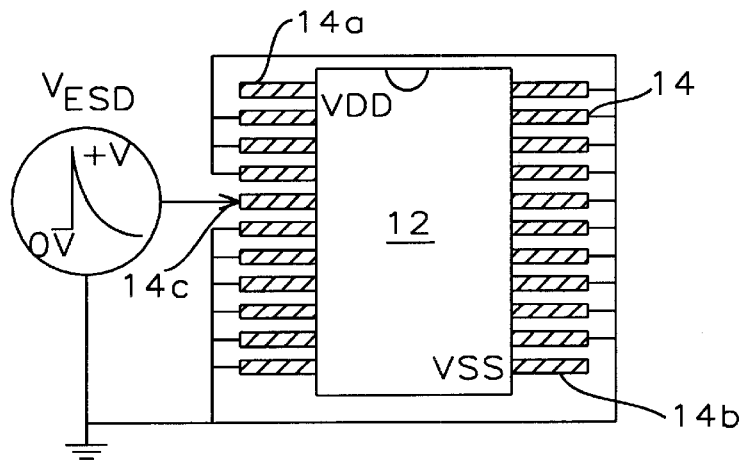
FIG. 2A
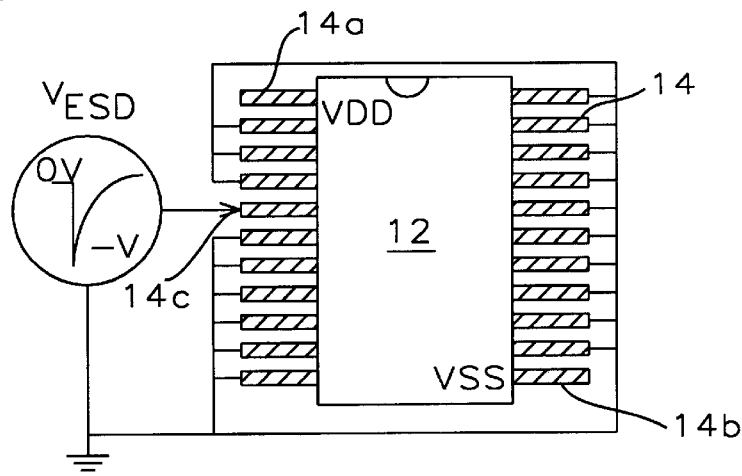
FIG. 2B

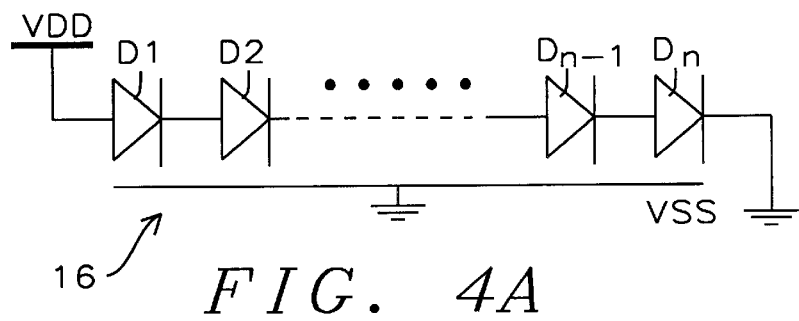
FIG. 4A
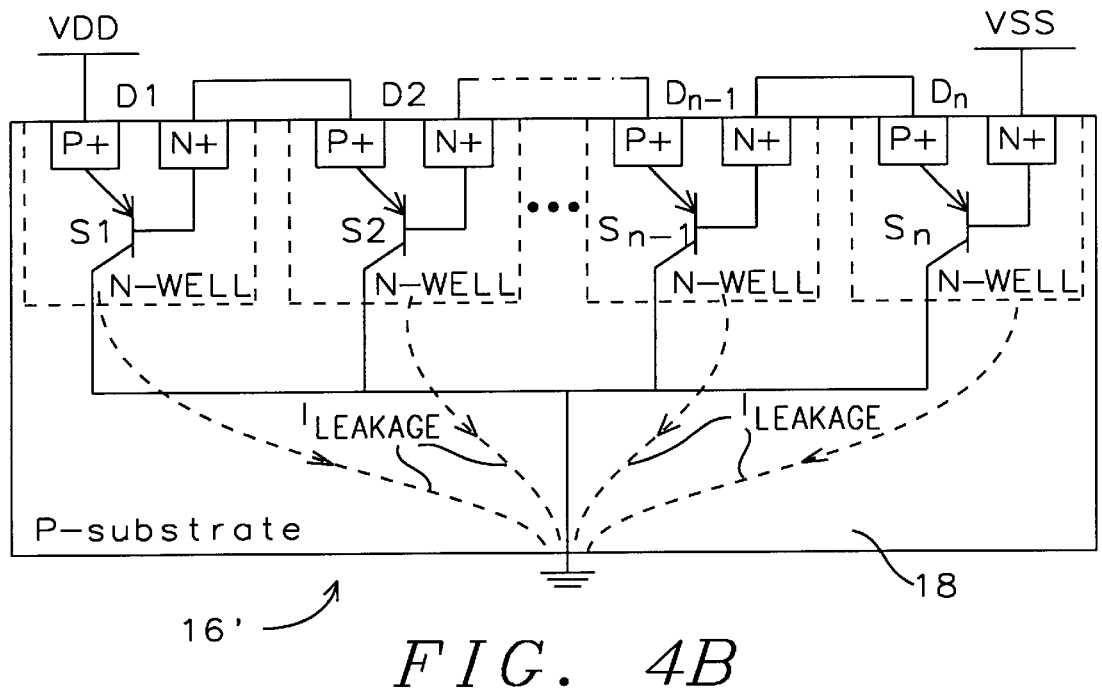
FIG. 4B
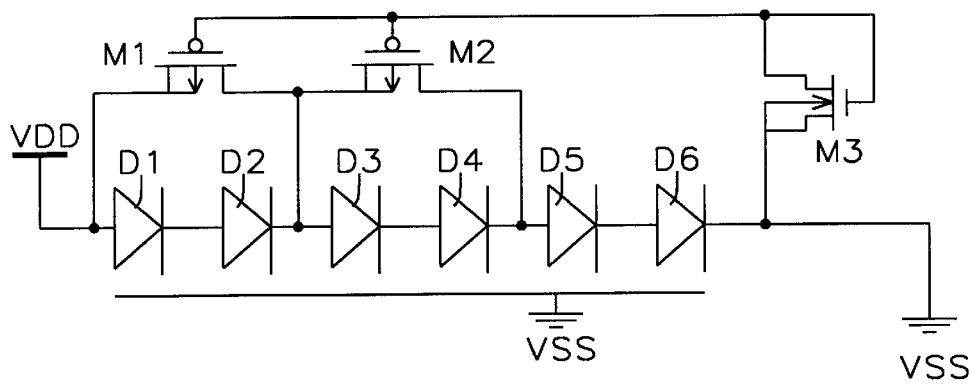
FIG. 5A — Prior Art

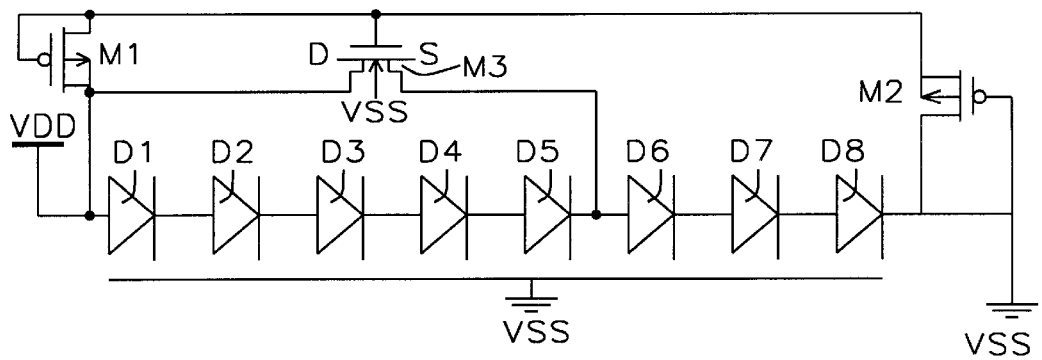
FIG. 5B – Prior Art
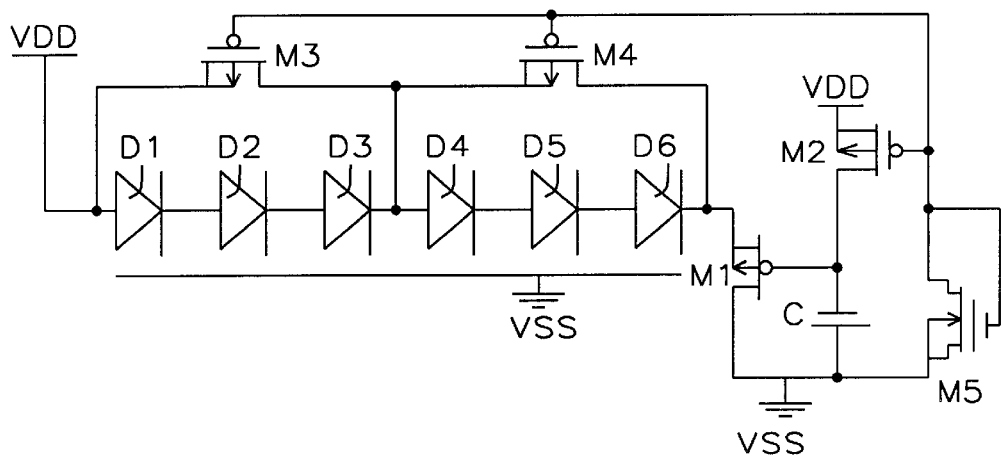
FIG. 5C – Prior Art
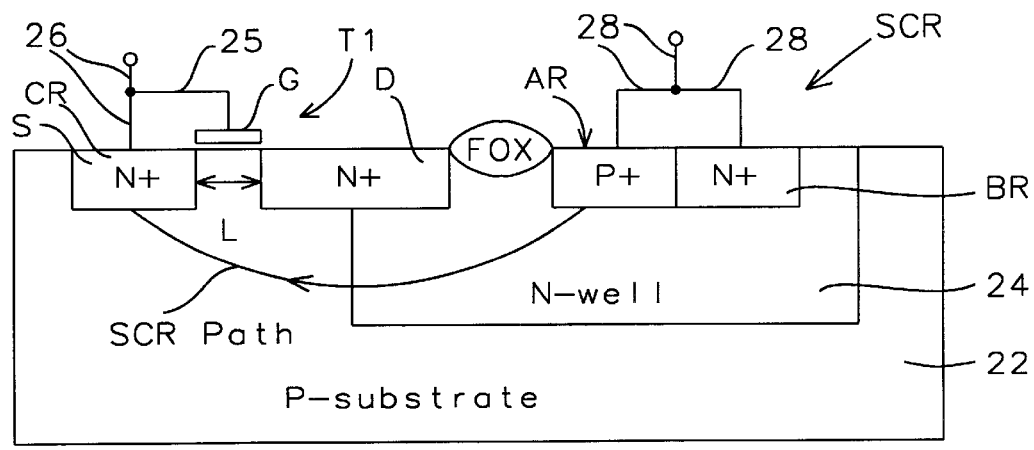
FIG. 6

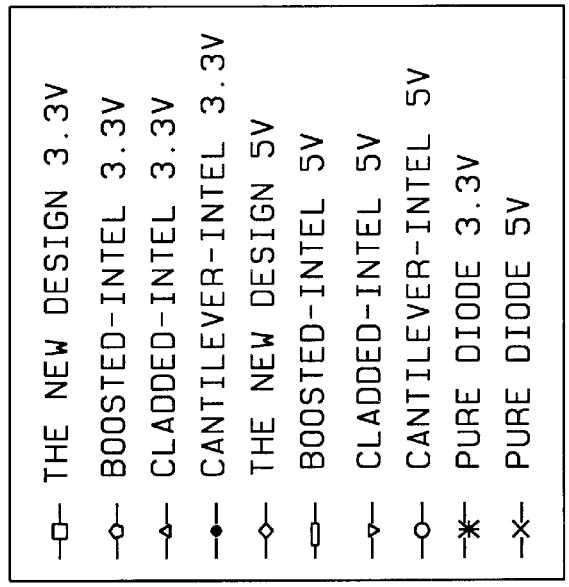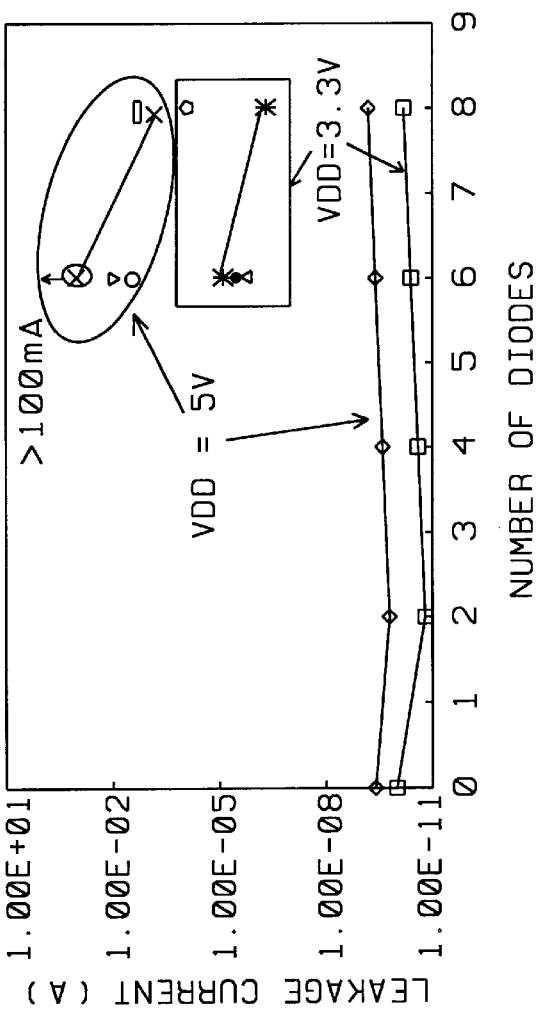
FIG. 18

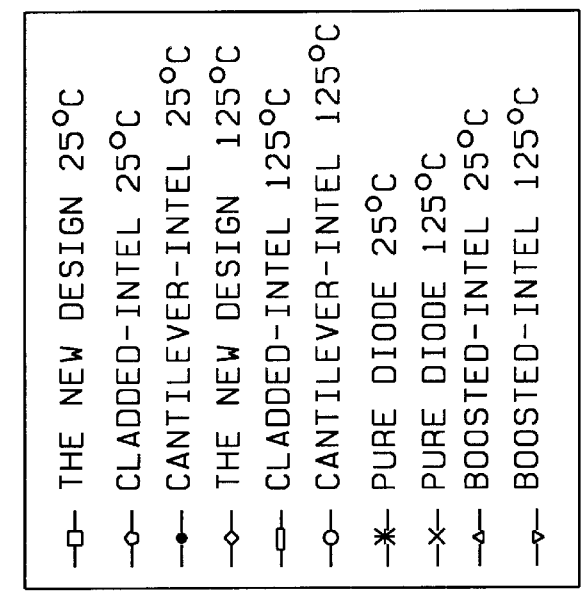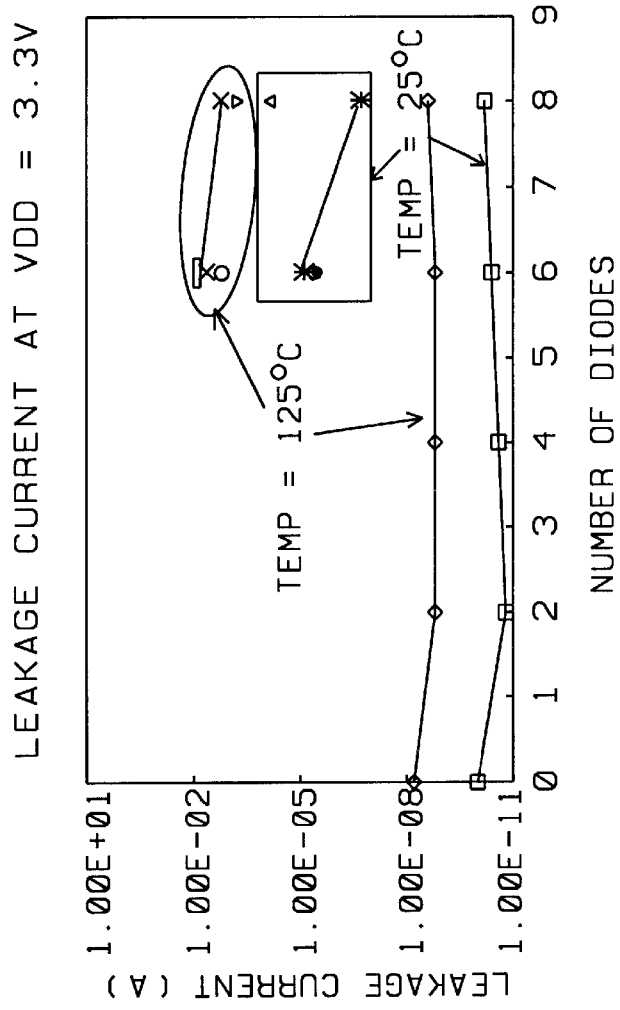
FIG. 19

LOW-LEAKAGE DIODE STRING FOR USE IN THE POWER-RAIL ESD CLAMP CIRCUITS

BACKGROUND OF THE INVENTION

1. Field of the Invention

This invention relates to ElectroStatic Discharge (ESD) protection for integrated circuits and more particularly to series connected diode strings employed for ESD protection.

2. Description of Related Art

1. ElectroStatic Discharge (ESD)

ElectroStatic Discharge (ESD) has been a serious reliability concern with respect to CMOS types of integrated circuit (IC) devices. As CMOS technology progresses into the deep sub-micron scale, the use of advanced processes such as thinner gate oxide, shorter channel length, shallower junction depth, LDD (Lightly-Doped Drain) structure, and salicide (Self-Aligned Silicide) diffusion is employed. The disadvantage of use of these processes on this extremely small scale is that there is serious degradation of the robustness of CMOS IC devices in avoiding of problems associated with ESD. In order to obtain suitable high robustness against damage from ESD, a CMOS IC must incorporate ESD protection circuits at every input and output pin. Nevertheless some unexpected ESD damage occurs in the internal circuits of CMOS IC devices beyond the input or output ESD protection circuits [1]–[6]. Even the parasitic capacitance and resistance along the power lines of an IC can also cause a negative impact on the ESD reliability of the CMOS IC [4]–[6].

As stress induced ESD effects may occur in response to positive or negative voltage on an input (or output) pin with respect to the grounded VDD or VSS pins, there are four different ESD stress combinations at each input (output) pin as shown in FIGS. 1A–1D [7]. Referring to FIGS. 1A–1D, a CMOS IC 10 which is housed within a dual-in-line package 12 having input/output pins 14 includes VDD pin 14a and VSS pin 14b.

Since ESD voltages may have positive or negative polarities on a pad associated with the VDD or the VSS pins 14a, 14b, there are four different ESD-stress mode conditions. FIGS. 1A–1D show modes of test combinations for ESD stress on an input (or output) pin with respect to the grounded VDD or VSS pins. FIG. 1A shows the PS-mode. FIG. 1B shows the NS-mode. FIG. 1C shows the PD-mode. FIG. 1D shows the NS-mode. Therefore input and output ESD protection circuits are designed to bypass the ESD current from the stress pin to the VDD or VSS pins.

(1) PS mode: ESD stress at a pin 14c with positive voltage polarity to the grounded VSS (GND) pin 14b when VDD pin 14a and other input/output pins 14 are floating (FIG. 1A);

(2) NS mode: ESD stress at a pin 14c with negative voltage polarity to the grounded VSS. (GND) pin 14b when VDD pin 14a and other input/output pins 14 are floating (FIG. 1B).

(3) PD mode: ESD stress at a pin 14c with positive voltage polarity to the grounded VDD pin 14a when VSS (GND) pin 14b and other input/output pins 14 are floating (FIG. 1C).

(4) ND mode: ESD stress at a pin 14c with negative voltage polarity to the grounded VDD pin 14a when VSS (GND) pin 14b and other input/output pins 14 are floating (FIG. 1D).

For comprehensive ESD testing, additional ESD stress combinations are shown in FIGS. 2A–2D. These four additional ESD-testing combinations are used to verify the whole-chip ESD reliability. These additional ESD stress combinations have been specified in the ESD testing standard to verify the whole-chip ESD reliability [7].

FIGS. 2A and 2B show the pin-to-pin ESD stress with the ESD voltage being applied to an input (or output) pin while all other input and output pins except for the VDD and VSS pins 14a/14b are grounded.

FIGS. 2C and 2D show the VDD-to-VSS ESD stress with the ESD voltage being directly applied to the VDD pin 14a with the VSS pin 14b grounded while all input and output pins are floating. The additional ESD testing combinations of FIGS. 2A–2D often lead to more complex ESD current paths from the power lines to internal circuits, which causes some unexpected damage to the internal circuits in spite of providing input and output ESD protection circuits in the IC devices [8]–[10].

FIG. 3 shows ESD current discharging paths in an IC during pin-to-pin ESD stress conditions. In particular, the pin-to-pin ESD stress, as shown in FIG. 3, often causes some unexpected ESD damage located in the internal circuits, rather than damaging the input or output ESD protection circuits. In FIG. 3, a positive ESD voltage is applied to an input pin IP with an output pin OP being grounded, while the VDD and VSS pins are both floating. The ESD current is diverted from the input pad IP to the floating VDD power line through the forward-biased diode D2, above diode D1, in the input ESD protection circuit. The ESD current flowing through the VDD power line can be diverted into the internal circuit INT through a connection to the VDD line. Then, the ESD current, which is discharged through the internal circuit INT, may cause random ESD damage in the internal circuit INT, along the Path_1 current path shown as dotted line in FIG. 3.

If there is an ESD clamp circuit CC, in parallel with the internal circuit INT, across the power rails comprising VDD power line and VSS ground line, the ESD current can be discharged through the Path_2 current path shown in FIG. 3. Therefore, the internal circuit INT can be safely protected against ESD damage. Thus, an efficient ESD clamp circuit between the power supplies is necessary to protect the internal circuit INT against ESD damage [11]–[16].

In summary, in FIG. 3 the ESD current discharging paths are shown in an IC during a pin-to-pin ESD stress condition. If the IC has no ESD clamp circuit CC between the power rails (VDD power line and VSS ground line), the ESD current is discharged through the Path_1, which often causes ESD damage to the internal circuit INT. If the IC has an effective ESD clamp circuit CC between the VDD and VSS power rails, the ESD current is discharged through the Path_2.

2. Diode Strings 2.1. The Diode String

Because a diode in the forward-biased condition can sustain a much higher ESD level than it can in the reverse-biased condition, a diode string with multiple cascaded diodes is therefore provided to clamp the ESD overstress voltage on the 3.3 Volts/5 Volts tolerant I/O pad [12] or between the mixed-voltage power lines [13]–[15].

FIG. 4A is a schematic circuit diagram which illustrates a PNP-based circuit 16 which incorporates a diode string D1, D2, . . . , Dn−1, Dn of diodes connected in series from power rail VDD to ground rail VSS. The circuit 16 is used as the ESD clamp from the power rail VDD to VSS power rail.

FIG. 4B is a cross-sectional view showing a device 16' which is an embodiment of the circuit 16 of FIG. 4A. Diode string D1, D2, ..., Dn−1, Dn is formed in a P-substrate 18 with the diodes formed in N-wells in substrate 18 which contains CMOS devices, not shown for convenience of illustration.

Each diode D1, D2, ..., Dn−1, Dn forms a parasitic vertical PNP transistor S1, S2, ..., Sn−1, Sn with P-substrate 18 in a common collector configuration. The required number "n", which is a positive integer, of diodes in the diode string of FIGS. 4A and 4B depends on three parameters, the leakage current $I_{Leakage}$ allowed at maximum operating voltage and temperature, the parasitic vertical PNP β gain, and the blocking voltage across the diode string. These relationships have been reported earlier [13]–[15]. The relevant equations are presented in the following:

$$V_{String}(I) = mV_D - nV_T \times \left[\frac{m(m-1)}{2}\right] \times \ln(\beta+1) \quad (1)$$

$$V_D(I) = nV_T \times (I/AI_S) \quad (2)$$

$$I_D = AI_S(e^{V/nV_T} - 1) \quad (3)$$

$$V_D(T_1) = nE_{g0} + (T1/T0) \times (V_D(T_0) - nE_{g0}/q) \quad (4)$$

where $V_{string}$=total voltage drop across m diodes,
$V_D$=forward turn-on voltage of one diode,
$I_D$=forward current through the diode,
$V_T$=KT/q called the thermal voltage
  (q=electron charge),
  (K=Boltzmann's constants)
  (T=absolute temperature),
n=ideality factor,
β=beta gain of a parasitic PNP transistor,
Is=saturation current of a P-N junction diode,
A=area of the P-N junction diode,
m=the number of diodes in the string, and
$E_{g0}$=the extrapolated bandgap of silicon (Si) at temperature of 0° K=1.206 eV.

Equation (1) shows that if the β gain is nearly zero, then cascading of diodes in the diode string D1, D2, ..., Dn−1, Dn leads to a linear increase in the turn-on voltage drop across the diode string when more diodes are cascaded. However, if the β gain is even 1 or larger, the addition of diodes does not linearly increase the voltage drop across the diode string, but causes more leakage to the substrate. This means that more diodes would be needed to support the same voltage at a specified current when the β gain of the parasitic vertical PNP increases. The I-V relation of a single diode in the forward-biased condition is shown in equation (2) and equation (3), where the forward current increases exponentially as the forward voltage of the diode increases. From equation (1)–equation (3), the main issue of the PNP-based diode string used as the VDD-to-VSS ESD clamp circuit is the leakage current, where the amplification effect of multi-stage Darlington beta (β8) gain will cause more leakage current through VDD to the P-substrate which is biased at VSS.

If the voltage difference between VDD and VSS becomes larger, the leakage current increases exponentially as seen in equation (3). Thus, more diodes must be inserted into the diode string D1, D2, ..., Dn−1, Dn to eliminate the leakage current through the forward-biased diode string. Another issue when cascading diodes in a diode string is the reduction of the turn-on voltage drop across the diode string at higher temperatures. The temperature effect can be seen in equation (4), where the temperature coefficient of $V_D$ is negative, because $$\frac{nEg0}{q} = 1.206 \text{ Volts}$$

is larger than $V_D$ (around 0.55 Volts to about 0.65 Volts for forward current of 1 μA to about 10 μA at room temperature). Thus even more cascaded diodes are required in the diode string D1, D2, ..., Dn−1, Dn to control a reasonable leakage current in the VDD-to-VSS ESD clamp circuit at a higher temperature. The additional number of cascaded diodes will occupy a large silicon area of an IC device.

2.2. Design on the Diode String to Reduce Leakage Current

To reduce the leakage current of a PNP-based diode string, especially operating in a high-temperature environment, three designs were shown by T. J. Maloney and S. Dabral in "Novel clamp circuits for IC power supply protection," Proc. of EOS/ESD Symp., pp. 1.1.1 to 1.1.12 (1995) [15], which are re-drawn in FIGS. 5A–5C.

FIG. 5A shows a Cladded diode string, which is a modification of the circuit of Maloney [12]), FIG. 12, page 1.1.6.

FIG. 5B shows a Boosted diode string, which is a modification of the circuit of Maloney [12]), FIG. 15, page 1.1.7.

FIG. 5C shows a Cantilever diode string, which is a modification of the circuit of Maloney [12]), FIG. 18, page 1.1.9 and U.S. Pat. No. 5,530,612 of Maloney for "Electrostatic Discharge Protection Circuits Using Biased and Terminated PNP Transistor Chains, FIG. 22.

2.2.1 The Cladded Diode String

Referring to FIG. 5A, as the number of cascaded diodes D1, D2 ... D6 increases, there is a declining incremental voltage across the PNP-based diode string because there is a lower current density through the latter diode stages. A way to solve that problem was provided by augmenting the diode string with a bias network to distribute small but significant forward current into the distal diode stages, D4, D5 and D6. The cladded diode string of series connected diodes D1, D2 ... D6 shown connected between VDD voltage and the VSS ground connection in FIG. 5A embodies this concept with two long channel PMOS transistors M1 and M2 operating in the triode region, which are used as resistors to provide forward current from power rail VDD to the distal cascaded diodes D3 and D4 from transistor M1 and D5 and D6 from transistor M2. NMOS transistor M3 is used as a resistive connection between VSS (ground) and the gates of M1 and M2. The source/drain circuits of transistors M1 and M2 are connected in series starting at the power rail VDD with the junction thereof connected to the junction between diodes D2 and D3. The other end of the source drain circuit is connected to the junction between diodes D4 and D5. The gate electrodes of transistors M1 and M2 are connected to the shorted drain/gate electrode of NMOS transistor M3 and the source of transistor M3 is connected to the cathode of diode D6 with both being connected to ground VSS. The device dimensions (W/L) of transistors M1, M2, and M3, are based on the previous design in the Maloney et al. [15] as 1.8/40, 1.8/40, and 1.8/5 (μm/μm), respectively, which are simulated by the SPICE program with 0.35 μm 1P3M SPICE parameters.

2.2.2 The Boosted Diode String

In FIG. 5B, a boosted diode string (a series connected string of diodes D1–D8) is shown embodying a similar concept to the cladded diode string, employing distribution of current to distal cascaded diodes D6–D8 in the series connected string of diodes D1–D8. The source/drain circuits of two very long channel transistors M1 and M2 are connected in series between the power rails VDD and VSS in parallel with the diodes D1–D8. The drain region and the gate electrode of transistor M1 are shorted together. Two very long channel transistors M1 and M2, are always on, but the two very long channel devices PMOS transistors M1 and M2 do not draw significant leakage currents. The drain of NMOS transistor M3 is connected to power rail VDD. The source of NMOS transistor M3 is connected to the node between diode D5 and diode D6. The gate electrode of transistor M3 is connected to the junction between the source/drain circuits of transistor M1 and M2.

When the voltage of the source node of M3 falls below the threshold voltage of M3 with respect to its gate voltage while at a high temperature, the source follower transistor M3 (which is a stronger device, capable of withstanding many micro-amperes of current) turns on until the distal part of the diode string is replenished adequately.

But, transistor M3 is completely off or provides only very small currents at lower temperatures. The device dimensions (W/L) of M1, M2, and M3, based on T. Maloney et al. [15] and SPICE simulations, are 1.8/40, 1.8/40, and 200/1 ($\mu m/\mu m$), respectively.

2.2.3 The Cantilever Diode String

FIG. 5C shows a circuit diagram which illustrates the design concept of the cantilevered diode string. The key to concept is to block the diode string D1–D6 from VSS in normal operation, which helps to avoid the amplification effect of multi-stage Darlington beta ($\beta$) gain among the vertical PNP transistors in the diode string causing the more leakage current into the P-substrate (not shown). But, when an ESD condition occurs, the diode string D1–D6 between VDD-to-VSS is turned on by a detection circuit which turns on transistor M1 to bypass the ESD current to ground.

In FIG. 5C, the PMOS transistor M1 is used as the termination of the diode string D1–D6 from VSS in normal condition but sinks a substantial amount of current when an ESD pulse is occurring. PMOS transistor M2 and capacitor C comprise the RC-based ESD detection circuit which distinguishes between an ESD condition and a normal condition, and turns transistor M1 on or off correctly. The PMOS transistors M3 and M4 are long channel devices used as the bias network as that shown in the cladded diode string design. Transistor M3 connects power rail VDD to the node between diodes D3 and D4 in the diode string D1, D2 . . . D6. A small NMOS transistor M5 provides a ground connection without allowing a power supply voltage across a single thin gate oxide. The device dimensions (W/L) of M1, M2, M3, M4 and M5, which are based on the previous report by T. Maloney [15] and the SPICE simulations, are 200/1, 1.8/40, 1.8/40, 1.8/40 and 1.8/5 $\mu m/\mu m$), respectively.

SUMMARY OF THE INVENTION

In accordance with this invention, a new power supply ESD clamp circuit with an SCR (Silicon Controlled Rectifier) device and a diode string is provided. The present invention can apply excellent ESD protection performance of an SCR and diode string circuit for a power supply ESD clamp, but without the disadvantages of the leakage current problem illustrated by the diode string designs [12]–[15] and the latchup issue in the SCR device from power rail VDD to power rail VSS.

BRIEF DESCRIPTION OF THE DRAWINGS

The foregoing and other aspects and advantages of this invention are explained and described below with reference to the accompanying drawings, in which:

FIGS. 1A–1D show four modes of test combinations for ESD stress on an input (or output) pin with respect to the grounded VDD or VSS pins.

FIG. 1A shows the PS-mode,

FIG. 1B shows the NS-mode,

FIG. 1C shows the PD-mode, and

FIG. 1D shows the ND-mode of ESD-stress conditions which can occur at an input or output pin of a CMOS IC.

FIGS. 2A and 2B show the pin-to-pin ESD stress with the ESD voltage being applied to an input (or output) pin while all other input and output pins except for some VDD and VSS pins which are grounded.

FIG. 4B is a cross-sectional view showing a device, which is an embodiment of the a circuit from FIG. 4A with a diode string of diodes formed in a P-substrate and diodes formed in N-wells in that substrate.

FIG. 5A shows a Cladded diode string.

FIG. 5B shows a Boosted diode string.

FIG. 5C shows a Cantilever diode string.

FIG. 6 shows a schematic cross-sectional view of an LVTSCR device.

FIG. 8A shows a schematic diagrams of circuits with an LVTSCR where there is an input ESD protection circuit in Chip 2.

FIG. 8B shows a schematic diagrams of circuits with an LVTSCR where there is an output ESD protection circuit in Chip 3, being accidentally triggered on by system-level overshooting noise pulses.

FIG. 8C is a graph showing the intercepted point between the I-V curves of the output PMOS and the LVTSCR decides the voltage level on the pad and the leakage current $I_L$ from power rail VDD to power rail VSS.

FIG. 14A is a graph for a single NCLSCR device, with four cascaded diodes at the temperature of 125° C.

FIG. 14B is a graph for a single NCLSCR with six cascaded diodes, at the temperature of 125° C.

FIG. 18 is a graph showing the leakage currents under 5 Volt and 3.3 Volt biases among several diode strings with different designs at the temperature of 25° C.

FIG. 19 is a graph showing the leakage currents among the different diode string designs at the temperatures of 25° C. and 125° C. under a 3.3 Volt bias.

FIG. 21A shows the original 0 Volt-to-8 Volt voltage pulse.

FIG. 21B shows the degraded voltage pulse clamped by the present invention with two cascaded diodes.

FIG. 21C shows the degraded voltage pulse clamped by this invention with four cascaded diodes. (y axis=2 V/Div., x axis=100 ns/Div.).

FIG. 23A shows the original three Volt-to-eight Volt pulse.

FIG. 23B shows the degradation voltage pulse clamped by the proposed design with two cascaded diodes. (y axis=2 V/Div., X axis=100 ns/Div.)

FIG. 29A shows a diagram for a diode string with a NCLSCR device.

FIG. 29B shows a diagram for a diode string with a PCLSCR device.

DESCRIPTION OF THE PREFERRED EMBODIMENT

This invention provides a diode string with very low leakage current which is provided for use in power supply ElectroStatic Discharge (ESD) clamp circuits. By adding an NMOS-controlled lateral SCR (NCLSCR) device in accordance with this invention to a cascaded diode string, the leakage current of the resultant diode string with six (6) cascaded diodes under 5 Volts (3.3 Volts) forward bias can be controlled below 2.1 (1.07) nA at a temperature of 125° C. in a 0.35 μm silicide CMOS process. The holding voltage of the device in accordance with this invention with NCLSCR can be linearly adjusted by changing the number of the cascaded diodes in the diode string for the application among the power lines with different voltage levels. From the experimental results, the ESD level of this ESD clamp circuit is greater than 8 kV (8,000 Volts) in the Human-Body-Model ESD test. Thus, the new diodes string of this invention is very suitable for application to portable or low power CMOS Integrated Circuit (IC) devices.

3. Diode String Design with Very Low Leakage Current

In this invention, we provide a new diode string design with very low leakage current for use in power supply ESD clamp circuits. By adding an NMOS-Controlled Lateral Silicon Controlled Rectifier (NCLSCR) device to the cascaded diode string, excellent ESD protection performance can be maintained without the disadvantages caused by the leakage current associated with the diode string designs described above and the VDD-to-VSS latchup issue in the SCR device.

3.1 The NMOS-Controlled Lateral SCR

Figure 2C:
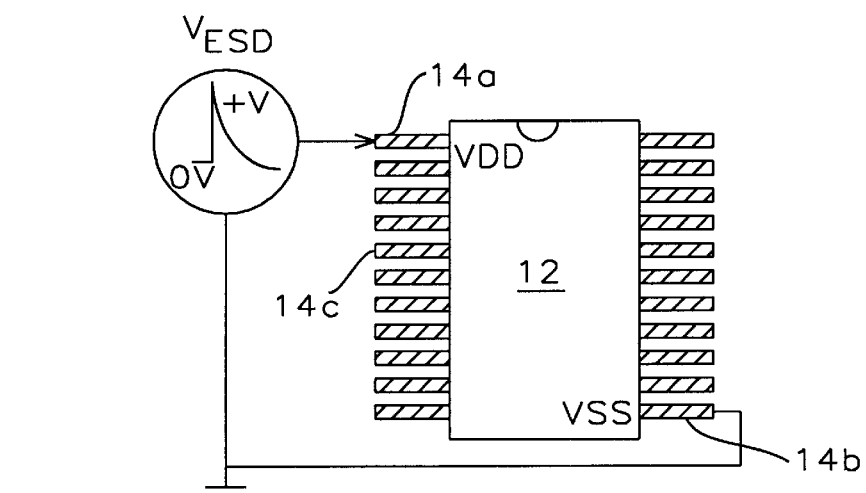
FIGS. 2C and 2D show the VDD-to-VSS ESD stress with the ESD voltage being directly applied to a VDD pin with the VSS pin grounded while all input and output pins are floating.
Figure 2D:
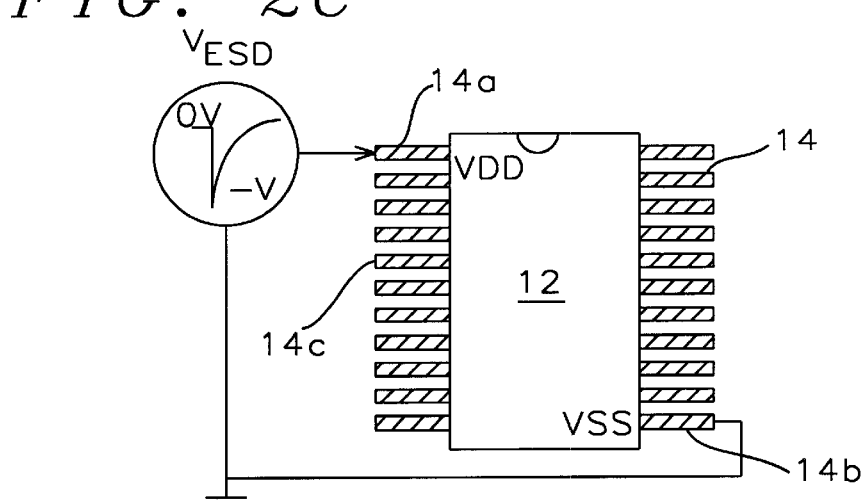
Figure 3:
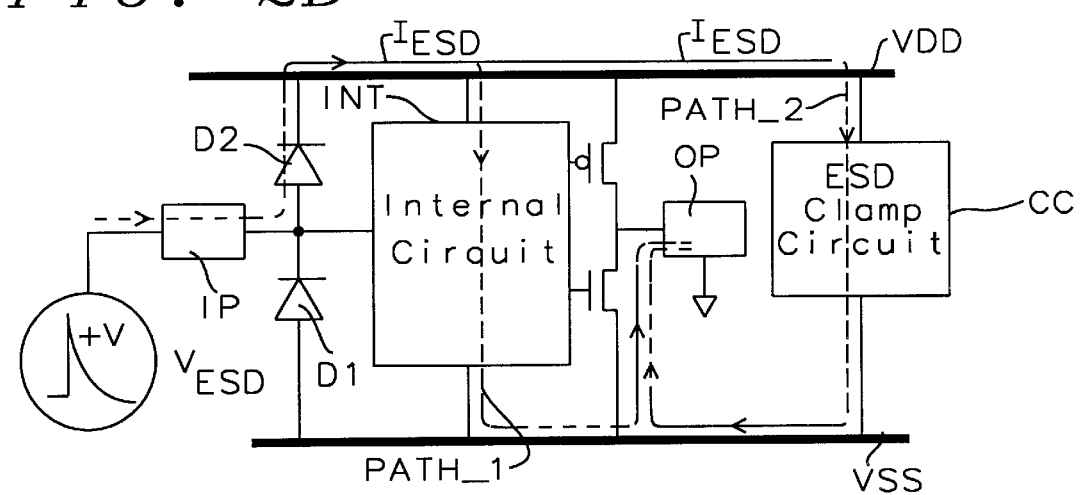
FIG. 3 shows ESD current discharging paths in an IC during pin-to-pin stress conditions.

FIG. 6 shows a schematic cross-sectional view of an LVTSCR device of the kind shown in FIG. 3 of reference

[19]. Due to the inherent capability of high power delivery, a lateral SCR device has been used as a protection element to bypass ESD stress. Experimental results had shown that the lateral SCR device can sustain high ESD stress within a minimum layout area as compared to other traditional ESD protection elements [18]. A modified design of a lateral SCR uses low-voltage-trigger lateral SCR (LVTSCR) devices to protect submicron CMOS IC devices [19]–[20]. FIG. 6 shows a schematic cross-sectional view of an LVTSCR device 20 formed in a P-substrate 22 which includes therein a N-well 24. A MOSFET device T1 is a short-channel thin-oxide NMOS FET, which includes an N+ source region S and N+ drain region D formed in the substrate 22 with a gate electrode G formed above the substrate 22 on a gate oxide layer (not shown) between the source region S and the drain region D. A field oxide region FOX is shown formed in the surface of the N-well 24 proximate to the P-substrate 22. The gate electrode G is shorted-circuited by line 25 to line 26. The drain region D, which straddles the N-well 24, was diffused across the junction edge between the N-well 24 and the P-substrate 22 to the left. As a result of the diffusion, the drain region D is juxtaposed with the field oxide region FOX. The LVTSCR 20 has an anode region AR and a cathode region CR in FIG. 6.

The LVTSCR device has a trigger voltage which is lower than the gate-oxide breakdown voltage of CMOS devices. As a high. voltage occurs at the anode region AR of the LVTSCR device 20, this high voltage is diverted to the drain D of the short-channel NMOS transistor T1. In the short channel NMOS transistor T1, there is a snapback breakdown voltage from the drain D to the source S which is generally lower than its gate-oxide breakdown voltage. In the snapback breakdown condition, the short channel NMOS device T1 causes current to flow from the N-well 24 to the P-substrate 22. The N-well to P-substrate junction is reverse biased. Therefore, the short-channel NMOS device T1 leads to a self-regeneration turn-on action of the lateral silicon controlled rectifier device SCR. After the turn on action, the LVTSCR device, alone, can provide ESD protection without additional secondary protection elements.

The DC trigger voltage of a pure lateral SCR device in a CMOS technology is equivalent to the breakdown voltage of the P-N junction between the N-well and the p-substrate, which is about 20 Volts to about 30 Volts in a submicron CMOS technology. But, the trigger voltage of an LVTSCR can be lowered to the drain snapback-breakdown voltage of short-channel thin-oxide NMOS device. With a sufficiently lower trigger voltage, the LVTSCR can provide more effective ESD protection with a compact layout area. For effective protection of the thinner gate oxide in the deep-submicron CMOS IC devices, a NMOS-Controlled Lateral SCR (NCLSCR) is provided. The NCLSCR device is formed by applying a control voltage on the gate of the NMOS of the LVTSCR. With a positive gate voltage, the trigger voltage of the NCLSCR device can be significantly reduced and easily triggered into the holding region. The greater control voltage on the gate of the NMOS will lead to a lower trigger voltage to turn on the NCLSCR. Thus, the NCLSCR is a more suitable ESD-protection device for use in deep-submicron technology with a thinner gate-oxide layer. But, such an NCLSCR device in an ESD protection circuit often causes the issue of a fatal danger of a latchup problem, especially in the power supply ESD clamp circuits which can cause a VDD-to-VSS latchup problem.

Due to the low trigger voltage (about 10 Volts), the LVTSCR device can perform excellent on-chip ESD protection without the support of the secondary protection circuit. But, its low trigger current (−10 mA) may cause the LVTSCR to be triggered on accidentally by external noise pulses while the CMOS IC is in the normal operating condition. Recently, due to the request of the "CE" mark from the European Community, an ESD gun with the ESD voltage of 8,000 Volts to 15,000 Volts is used to test the ElectroMagnetic Compatibility (EMC) of the electronic products [21]–[23].

Figure 7A:
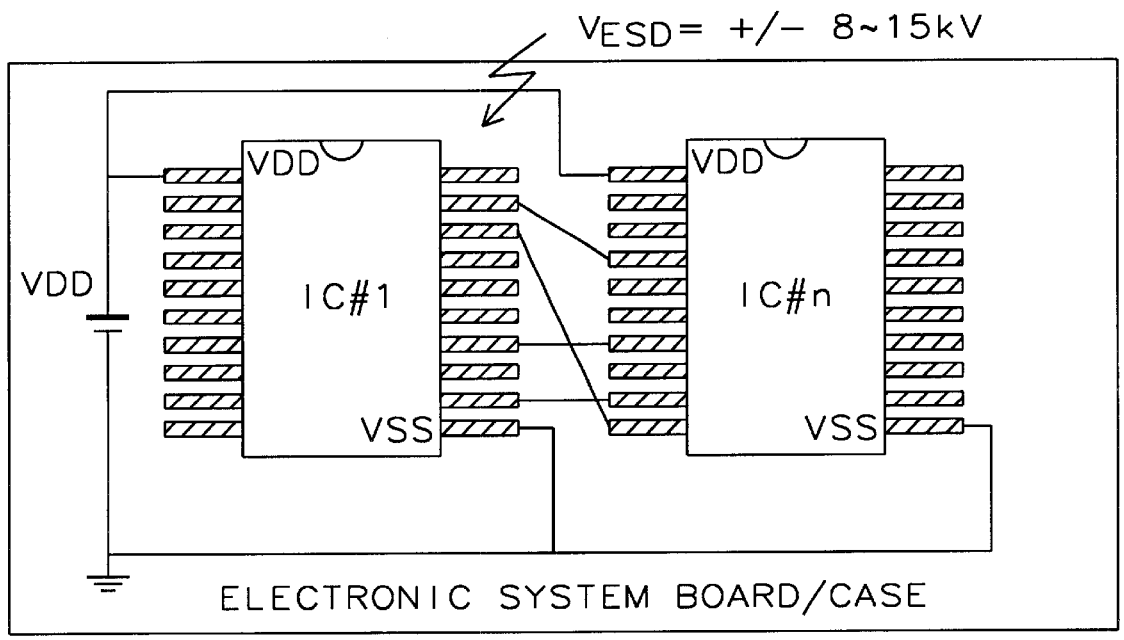
FIG. 7A is a schematic diagram of a system-level ESD/EMC test setup.

FIG. 7A is a schematic diagram illustrating a system-level ESD/EMC test.

Figure 7B:
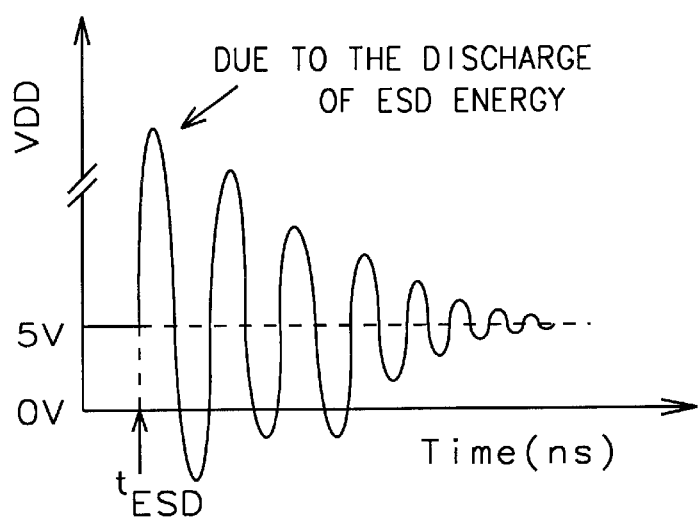
FIG. 7B is a graph showing the transient overshooting/undershooting voltage waveform on a VDD pin of an integrated circuit during the EMC/ESD test of FIG. 7A.

FIG. 7B shows the transient overshooting/undershooting voltage waveform on a VDD pin of an integrated circuit during the EMC/ESD test of FIG. 7A.

The system-level EMC/ESD test is illustrated in FIG. 7A. Such an EMC/ESD test can cause a heavily overshooting or undershooting voltage transition on the VDD pins of the IC devices in the system board, as shown in FIG. 7B. During such system-level EMC/ESD test, the power lines of IC devices in the system board can be coupled with an over-stress voltage even up to several hundreds volts. Such a system-level EMC/ESD event easily causes the transient-induced latchup failure in CMOS IC devices [24]–[26]. If a single lateral SCR or an LVTSCR device is used as the ESD clamp device between the power rails (power lines) VDD and VSS of CMOS IC devices, such ESD-protection SCR devices are easily triggered on by the system-level EMC/ESD transient pulses to cause very serious VDD-to-VSS latchup problem in CMOS IC devices.

The LVTSCR devices in the input or output ESD protection circuits are also susceptible to such system-level noise pulses. Because the holding voltage of the LVTSCR is only −1 Volt, the voltage levels of the input or output signals can be destroyed if the LVTSCR in the ESD protection circuits is accidentally turned on when the IC is in the normal operating condition [27].

Figure 8A:
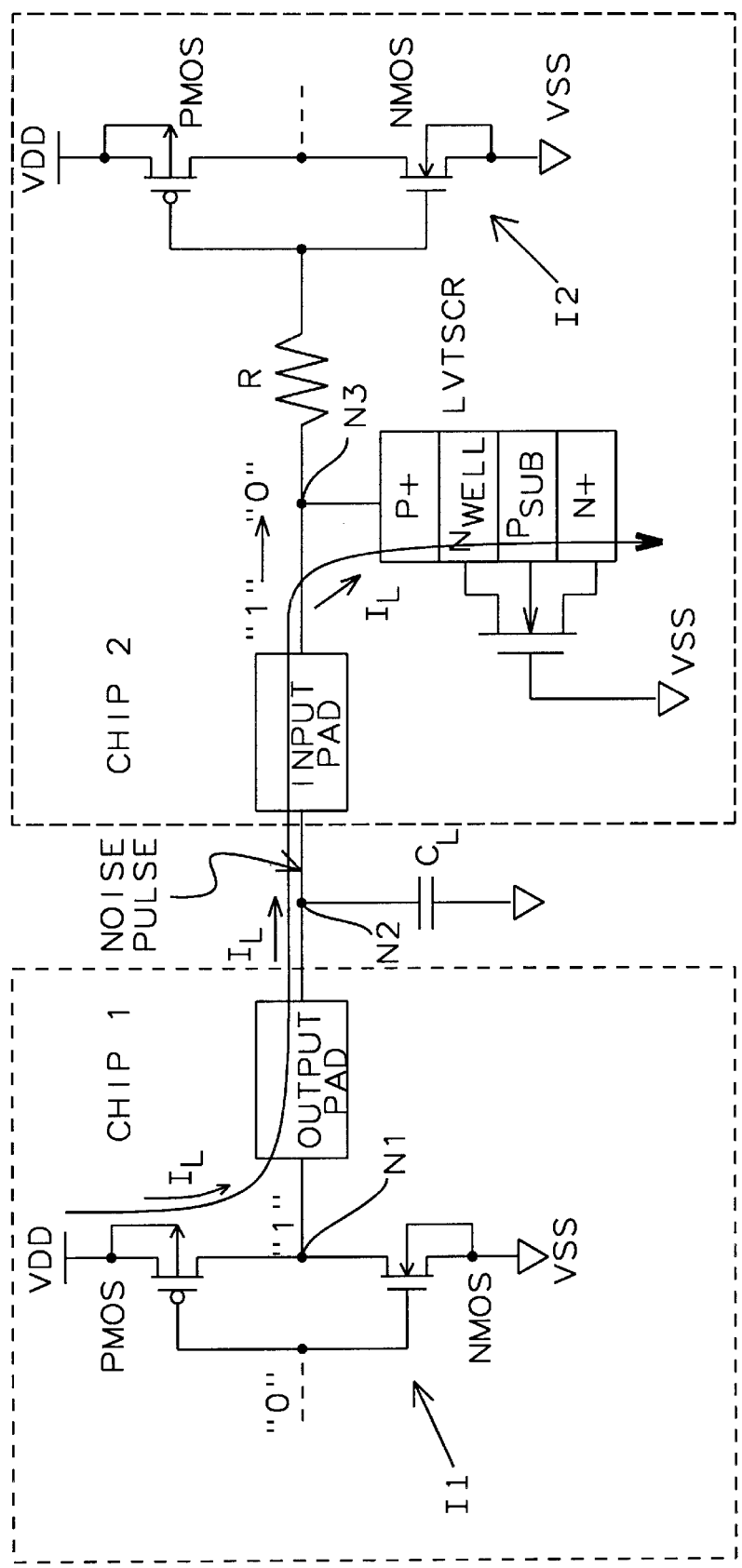
FIGS. 8A–8C relate to circuits with LVTSCR devices therein.
Figure 8B:
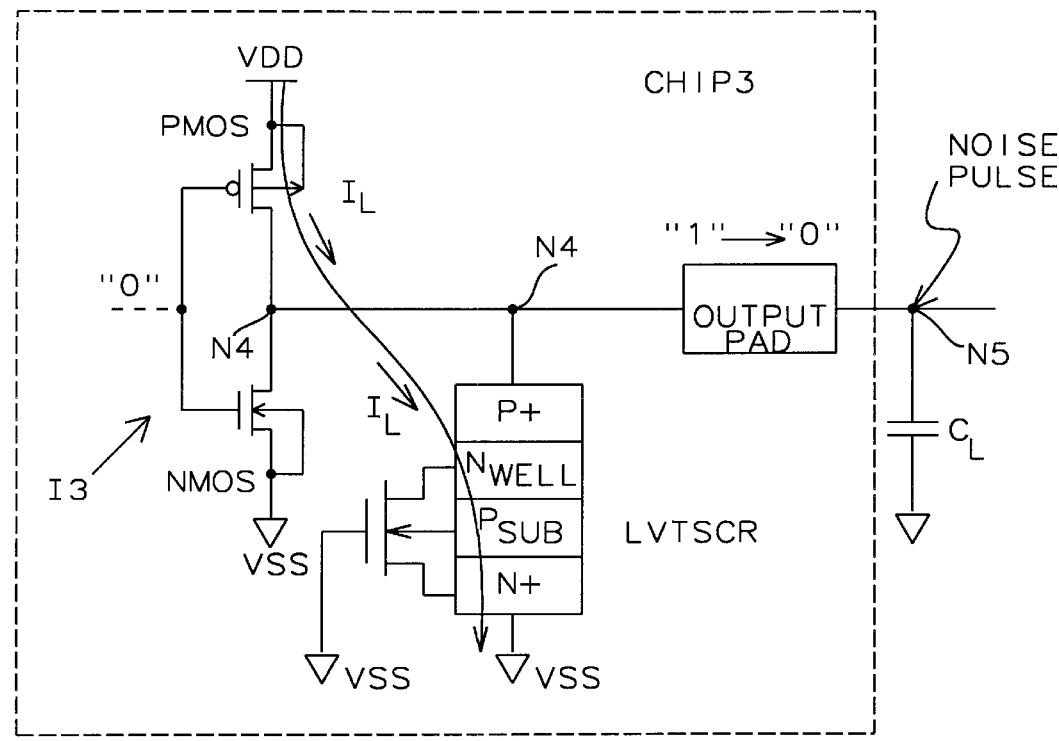
Figure 8C:
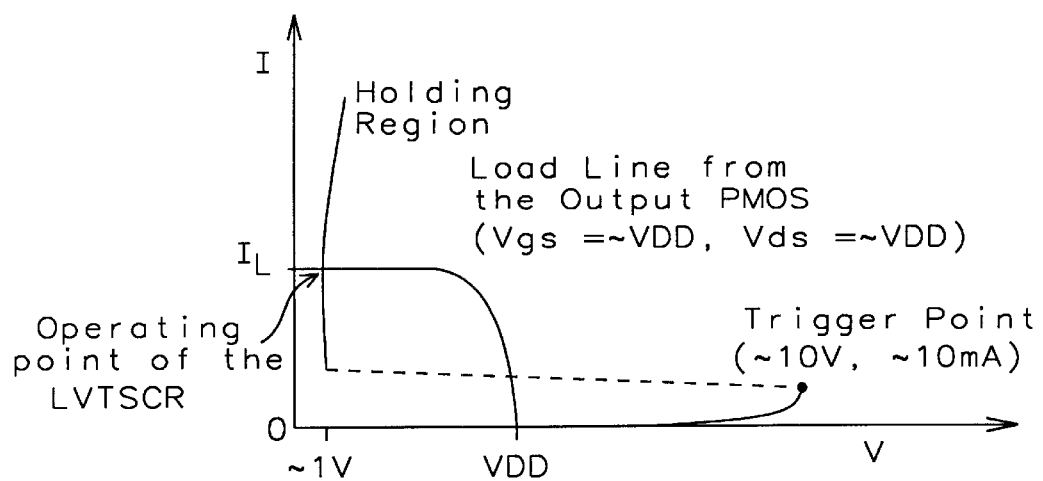

FIGS. 8A–8C relate to circuits with LVTSCR devices therein.

FIG. 8A shows a schematic diagrams of circuits with an LVTSCR where there is an input ESD protection circuit in Chip 2. The signal logic "0" is introduced to a PMOS/NMOS inverter I1 and passes to node N1 as a logic "1" and then passes further through an output pad and then from chip 1 to node N2 which is connected through a capacitor $C_L$ to ground. At node N2, a noise pulse is present. The node N2 is connected to chip 2 through an input pad to node N3. Node N3 is connected to the P+ anode region AR of the LVTSCR. The N+ cathode regions of LVTSCR is connected to ground. The gate of the LVTSCR is also grounded.

FIG. 8B shows a schematic diagrams of circuits with an LVTSCR where there is an output ESD protection circuit in Chip 3, being accidentally triggered on by system-level overshooting noise pulses.

FIG. 8C is a graph showing the intercepted point between the I-V curves of the output PMOS and the LVTSCR decides the voltage level on the pad and the leakage current $I_L$ from VDD to VSS.

For example, in FIG. 8A, the output buffer of Chip 1 is used to drive the input pad of Chip 2, where the input ESD protection circuit in Chip 2 is formed by the LVTSCR. While the output buffer in Chip 1 sends an output signal of logic "1" to the input pad of Chip 2, the output PMOS in Chip 1 is turned on by the pre-buffer circuit with a logic "0". Therefore, the voltage level on the input pad of Chip 2 is charged up to VDD, and the LVTSCR is initially kept off. But, if there is a board-level noise pulse coupled to the interconnection line between the output pad of Chip 1 and the input pad of Chip 2, the LVTSCR in Chip 2 may be triggered on by the overshooting noise pulse and the voltage level on the input pad is dropped down to only about 1 Volt. If the LVTSCR device is used in the output ESD protection circuit, as shown in FIG. 8B, the LVTSCR could be also triggered on by the noise pulse coupled to the output pad. Because the output PMOS often has a large device dimension to drive an external heavy load, the load line of the output PMOS has a stable intercept point on the I-V curve of the LVTSCR. The intercept point in FIG. 8C is the operating point of the LVTSCR, where there is a current $I_L$ flowing from the VDD through the output PMOS and LVTSCR to the VSS. Due to the triggering of noise pulses, the turned-on LVTSCR clamps the voltage level on the input pad of Chip 2 (the output pad of Chip 3) from VDD to about 1 Volt. This changes the logic state from "1" to "0" on the pad and causes an operation error in the application system. Moreover, the board-level leakage current $I_L$ (about 100 mA, dependent on the device dimension of the output PMOS) from VDD to VSS consumes more system power. Therefore, the LVTSCR, SCR, or NCLSCR should be modified to overcome the latchup issue before they were used in the on-chip ESD protection circuits.

3.2 Low-Leakage Diode String

Figure 9:
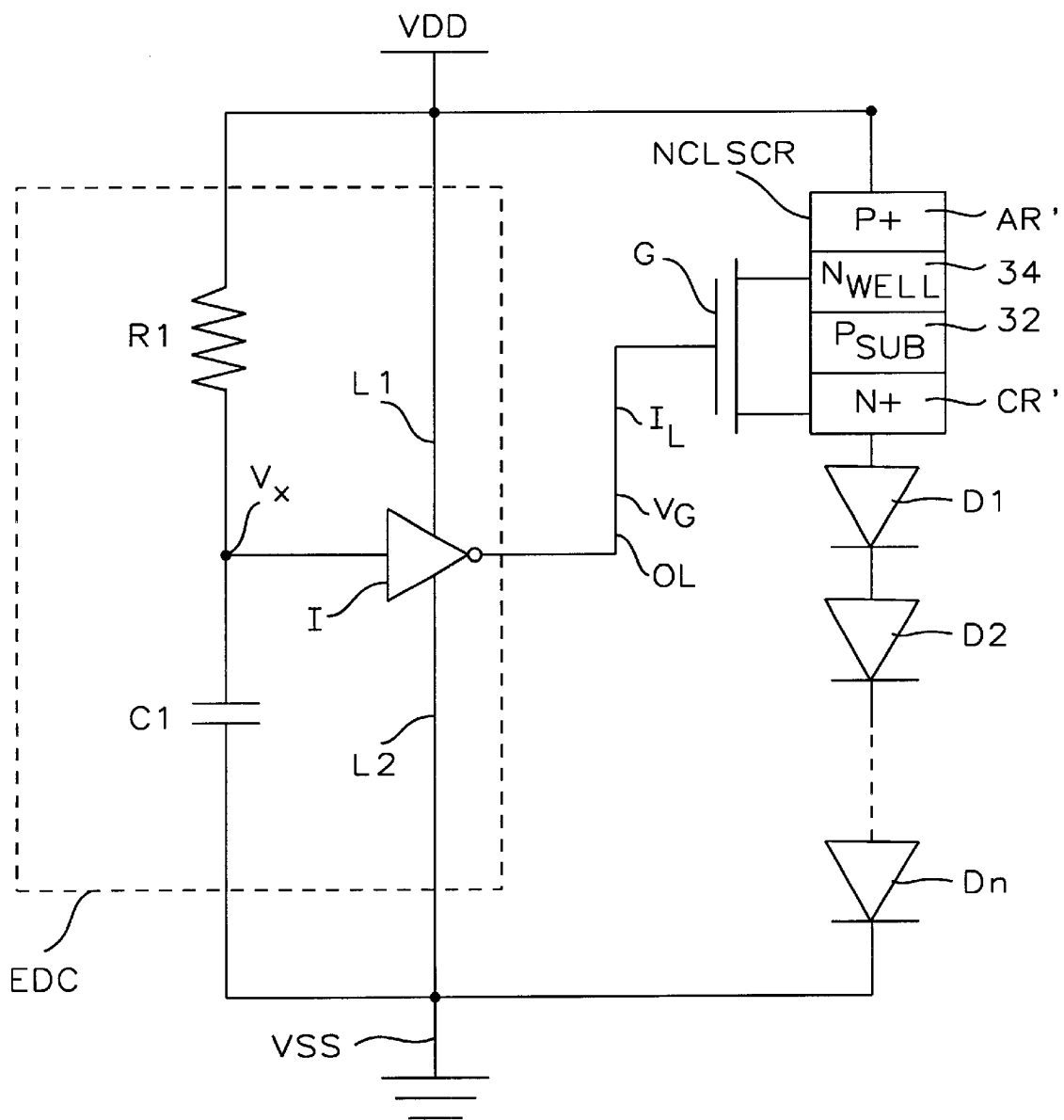
FIG. 9 shows a schematic circuit diagram of a NMOS-Controlled Lateral SCR device (NCLSCR) device in accordance with this invention for reducing the leakage current.

FIG. 9 shows a schematic circuit diagram of a device in accordance with this invention for reducing the leakage current. The circuit of FIG. 9 includes a power line VDD and a ground line VSS. A pair of circuits is connected in parallel between the power rails comprising VDD power line and the VSS ground line as well as being interconnected by an inverter gate connection. One circuit is an ESD-detection circuit EDC. The other circuit is an NMOS Controlled Lateral SCR (NCLSCR) device which is in series with a series connected diode string D1, D2 . . . Dn.

ESD-detection Circuit

Figure 22:
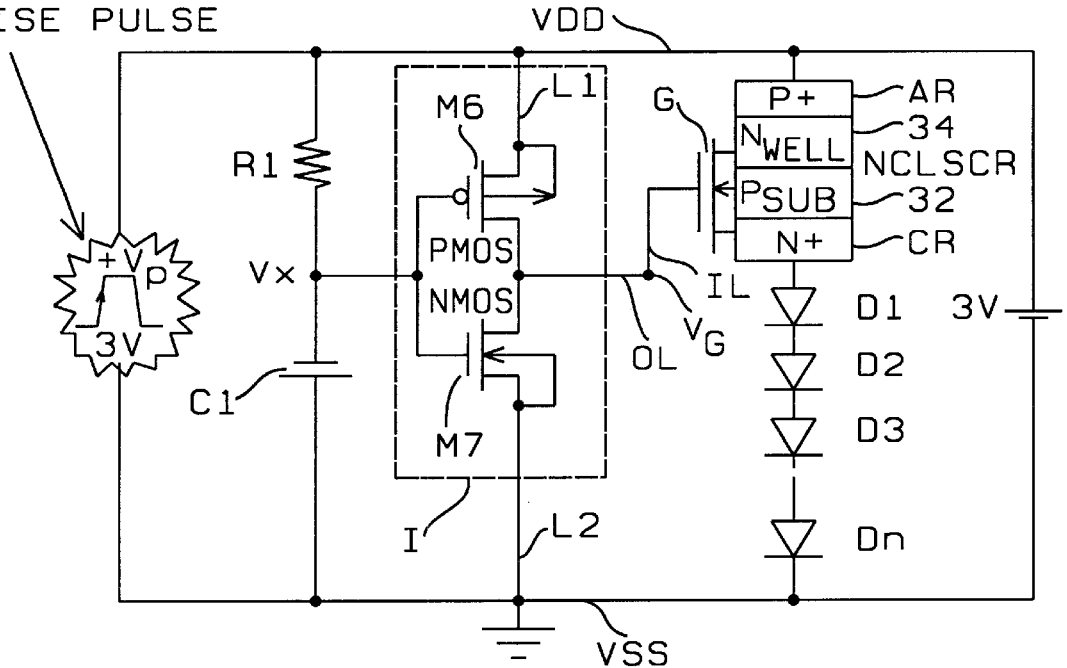
FIG. 22 shows a schematic diagram of another experimental setup of this invention employed to verify the latchup issue of the ESD clamp circuit between the power rail VDD and power rail VSS with the low-leakage diode string and the NCLSCR device in the normal operating condition with a three Volt VDD bias.

The ESD-detection circuit EDC includes a resistor R1 connected between VDD and node Vx and a capacitor C1 is connected between node Vx and ground voltage Vss. An inverter I is connected between node Vx and the gate G via line $V_G$. The inverter I is a pair of transistors such as PMOS/NMOS transistors M6/M7 seen in FIG. 22 connected between power line VDD and ground line VSS. Line L1 connects from the inverter I to voltage line VDD and line L2 connects from the inverter I to ground line VSS as seen in FIG. 22.

Lateral SCR Device NCLSCR

Figure 10:
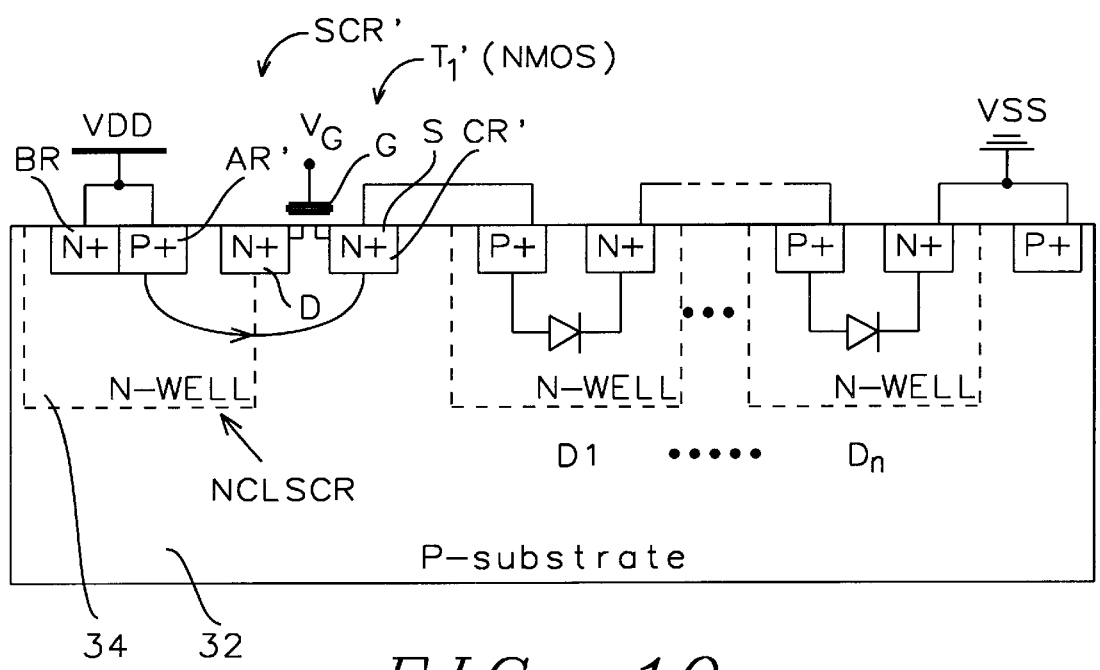
FIG. 10 shows a cross-sectional view of the device of FIG. 9 with a diode string D1, D2 . . . Dn embodied in a P-substrate CMOS process.

The power line VDD is connected to the P+ anode region AR of one lateral SCR device NCLSCR. The NCLSCR includes the P+ anode region AR located in an N-well 34 in P-substrate 32 and an N+ drain region D seen in FIG. 10 of a MOSFET T1' which straddles the N-well 34 and the P-substrate 32 (as in FIG. 6). As seen in FIG. 10, the source S (N+ diffusion) of the FET T1' (which is also the cathode of the FET device) is connected to the anode of the proximal diode D1 of the diode string D1, D2 . . . Dn, and the gate electrode G of the lateral SCR device NCLSCR is connected through input line IL to a node $V_G$ which is connected to the output line OL from the inverter I.

Series Connected Diode String

The series connected diode string D1, D2 . . . Dn is provided with the cathode CR' of the device NCLSCR connected to the anode of diode D1 which is at the inboard end of the diode string D1, D2 . . . Dn. The cathode of distal diode Dn is connected to ground potential VSS. The gate G of FET transistor T1' is connected to line $V_G$.

FIG. 10 shows a cross-sectional view of the device of FIG. 9 with a diode string D1, D2 . . . Dn embodied in a P-substrate of a CMOS device. Referring to FIGS. 9 and 10 an NMOS-controlled lateral SCR (NCLSCR) device is added to the left of the diode string D1, D2 . . . Dn to block the leakage current from VDD to VSS through the diode string D1, D2 . . . Dn, while the IC is in the normal operating condition. But, the lateral SCR NLCSCR is designed to be quickly turned on for the purpose of bypassing the ESD current from VDD to VSS through the diode string, while the IC is in the ESD-stress condition.

Operation of ESD-detection Circuit

To achieve the correct turn-on and turn-off operations of the NMOS-controlled lateral SCR device NLCSCR, the RC-based ESD-detection circuit [16] is applied to control the gate voltage of the device NCLSCR. To meet such a requirement, the RC time constant in the RC-based ESD-detection circuit is designed about 0.1–1 $\mu$s to distinguish the ESD transition and the VDD power-on transition. The RC-based ESD-detection circuit is also protected by the diode string and is safe during the ESD condition, because the turn-on voltage of the device NLCSCR is lower than the drain-snapback breakdown voltage or gate-oxide breakdown voltage of any other devices to be protected. The device NLCSCR with the diode string will be turned on first under the ESD condition to bypass the ESD current. Therefore, the RC-based ESD detection circuit or the internal circuits will not be damaged by the ESD stress.

The human-body-model ESD voltage has a rise time about –10 ns [7]. When an ESD voltage is across the VDD and VSS power rails, the voltage level of Vx shown in FIG. 9 is increased much slower than the voltage level on the VDD power line, because the RC circuit has a time constant of about 0.1–1 $\mu$s. Due to the delay of the voltage increase on the node Vx, the inverter I in FIG. 9 is self-biased by the ESD voltage on the VDD power line and conducts a high voltage through the line $V_G$ to the gate G of the device NLCSCR. If the gate of the device NLCSCR has a positive voltage relative to the VSS power line, the device NLCSCR will be turned on. Therefore, the ESD current can be discharged from VDD to VSS power rails though the device NLCSCR and the diode string without causing unexpected ESD damage located at the internal circuits.

Under the normal VDD power-on condition, the VDD power-on waveform has a rise time in the order of millisecond (ms). With such a slow rise time in the order of the ms range, the voltage level on the node Vx in the ESD-detection circuit with a RC time constant of about 0.1 $\mu$s to about 1 $\mu$s can follow the VDD voltage in time to keep the line $V_G$ at 0 Volt. While the gate of the device NLCSCR is kept at 0 Volt, the device NLCSCR is kept off to block the leakage current from VDD to VSS through the diode string. Because the leakage current of the device NLCSCR is mainly composed by the sub-threshold current of the NMOS transistor and junction leakage current between the N-well and the P-substrate which are not increased enormously when the environment temperature becomes higher, the leakage current of the present invention can be successfully reduced to a very low current level without using the complex design methods as those shown in FIGS. 5A–5C.

To overcome the of latchup danger, the holding voltage of the device can be designed to exceed the voltage difference between the power rails by adding specified number of cascaded diodes to the diode string. With a sufficiently large holding voltage, latchup cannot be held even if the device NLCSCR is accidentally triggered on by an overshooting noise pulse. In fact, when an overshooting noise pulse occurs across the power rails, the device NLCSCR would turn on to clamp it to a voltage level around the holding voltage of the device. When the overshooting noise pulse disappears, the device NLCSCR device turns off and blocks the leakage current through VDD to VSS. Thus, this invention is also advantageous for clamping the overshooting noise on the power rails, when the IC is in the normal operation conditions with the VDD and VSS power biases.

3.3 Blocking Voltage of Low-Leakage Diode String

Because the device NLCSCR is used in the low-leakage diode string to reduce the leakage current, the present invention may be dangerous to suffer latchup danger when it is used as a power supply ESD clamp circuit. Therefore, a simple design equation used to describe the I-V relationship of the device are calculated in the following.

Figure 11:
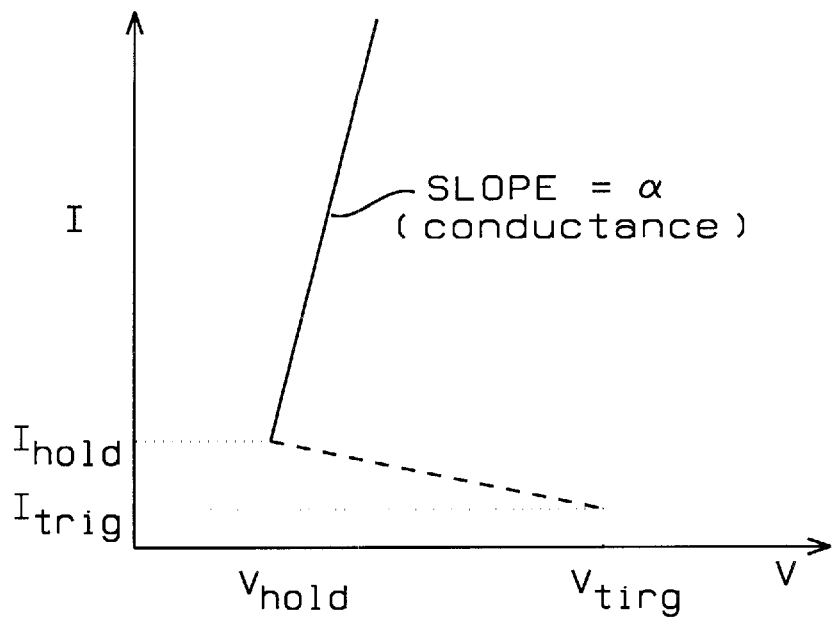
FIG. 11 is a graph of showing typical I-V curves of a single NCLSCR device.

The typical I-V curve of a NCLSCR device is shown in FIG. 11 with the important parameters of the trigger voltage (current) and holding voltage (current). When the device is in the normal condition, the NCLSCR device is in the block region. However, when the device is accidentally triggered on to cause latchup or in the ESD condition, the NCLSCR is in the holding region. Therefore, only the I-V characteristics of the NCLSCR device in the holding region is interested in the design equation for latchup avoidance. The I-V relation of the NCLSCR device in the holding region can be presented by a piecewise-linear method as $$I_{SCR}(V) = I_{hold} + \alpha(V - V_{hold}) \text{ when } V \geq V \quad (5)$$

where $I_{SCR}$ is the current through the NCLSCR device, $\alpha$ is the conductance of the NCLSCR device in the holding region, $I_{hold}$ is the holding current of the NCLSCR device, and $V_{hold}$ is the holding voltage of the NCLSCR device. From equation (5), the voltage across the NCLSCR device ($V_{SCR}$) in the holding region can be presented as follows:

$$V_{SCR}(I) = V_{hold} + \left[\frac{I - I_{hold}}{\alpha}\right] \text{ when } I \geq I_{hold} \quad (6)$$

By applying the superposition principle on the design of the device of this invention, the I-V relationship of the device in the holding region can be derived from equation (4) and equation (6) as $$V_{Total}(I) = V_{SCR}(1) + V_{string}(I) \text{ when } I \geq I_{hold} \quad (7)$$

By substituting equation (2) in equation (7), the I-V relationships of the design in the holding region can be presented as follows:

$$V_{SCR}(I) = V_{hold} + \left[\frac{I - I_{hold}}{\alpha}\right] + m\left[nV_T \times \ln\left[\frac{I}{AI_s}\right]\right] - \quad (8)$$
$$nV_T \times \left[\frac{m(m-1)}{2}\right] \times \ln(\beta + 1) \text{ when } I \geq I_{hold}$$

where $V_{Total}$ is the total blocking voltage across the design with the number "m" of cascaded diodes, where "m" is a positive integer. From equation (8), a suitable number of the cascaded diodes in the design can be calculated to make its holding voltage exceed the voltage difference between VDD and VSS power rails. With the holding voltage is greater than the voltage difference between VDD and VSS power rails, the design can be latchup-free for using in the VDD-to-VSS ESD clamp circuit.

3.4 Experimental Results of the Low-Leakage Diode String

The previous designs on the diode strings were all practically fabricated on a single test-chip in a 0.35 $\mu$m silicide CMOS process using neither the ESD-implantation nor the silicide-blocking process modifications. Thus experimental results were used to compare the performance of the new diode string of this invention and previous designs for use in a power supply ESD clamp circuit.

3.4.1 I-V Characteristics

Figure 12A:
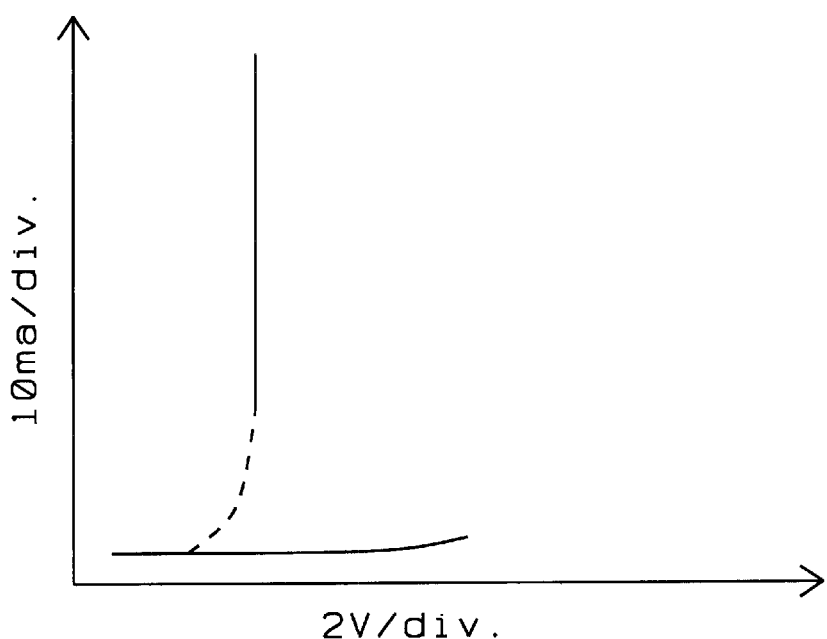
FIGS. 12A is a graph showing I-V curves of a single NCLSCR device with four cascaded diodes.

FIG. 12A shows measured I-V curves of the NCLSCR with four (4) cascaded diodes under different gate biases at a temperature of 25° C.

Figure 12B:
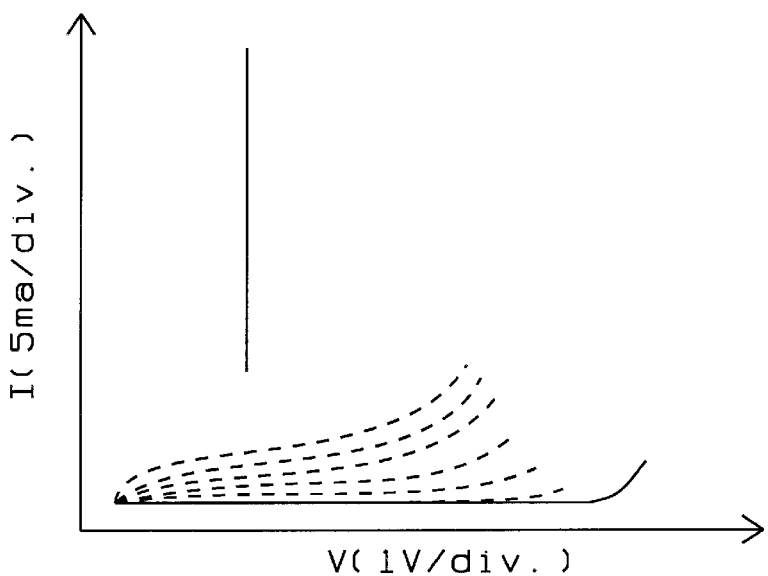
FIG. 12B is a graph showing I-V curves of only a single NCLSCR, with different gate biases in a 0.35 $\mu m$ silicide CMOS process.

FIG. 12B shows the I-V curves of a single NCLSCR at a temperature of 25° C.

The trigger voltage of the NCLSCR with a different number of diodes can be reduced when the gate bias ($V_G$) on the NCLSCR device is increased.

Figure 13:
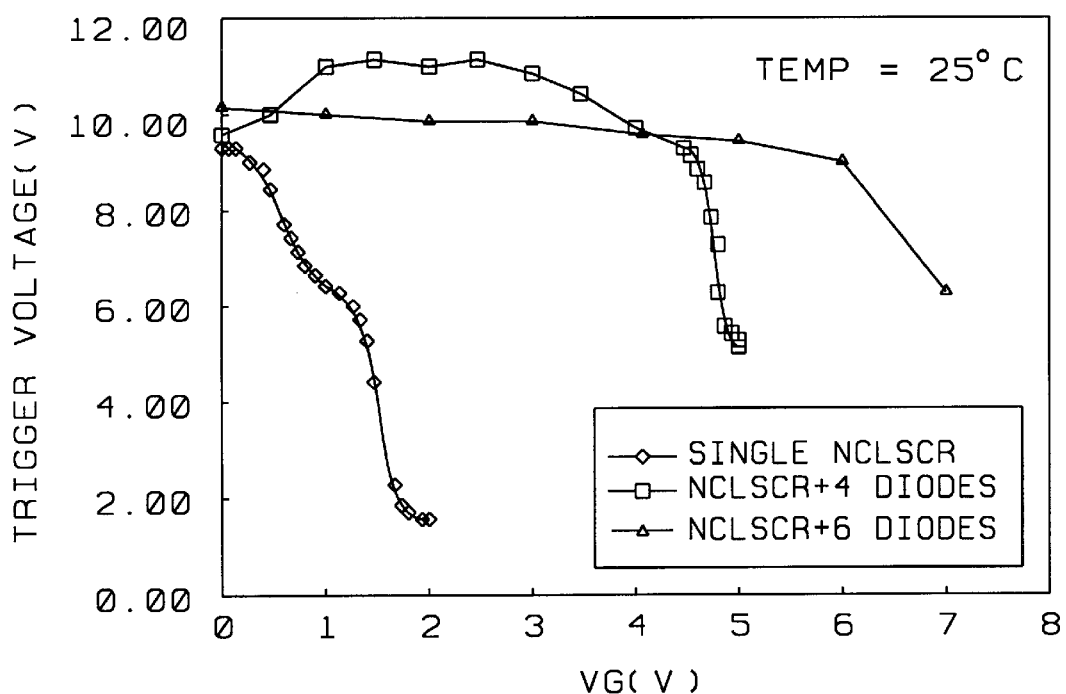
FIG. 13 is a graph showing the dependence of the trigger voltage of an NCLSCR device with different numbers of diodes on the gate bias at the temperature of 25° C.

FIG. 13 shows the dependence of the trigger voltage of the NCLSCR with different number of diodes on the gate bias.

Figure 14A:
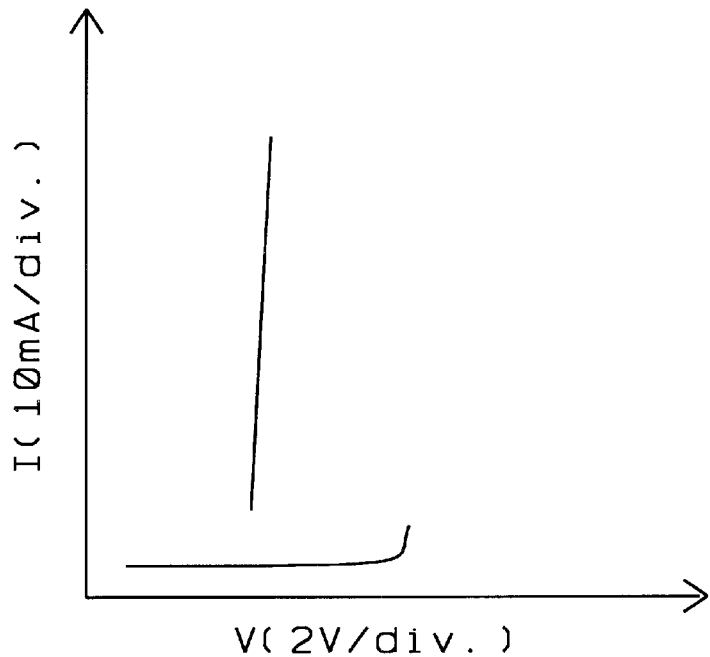
FIGS. 14A and 14B are graphs showing measured I-V curves in the holding region for circuits with NCLSCR devices at the temperature of 125° C.
Figure 14B:
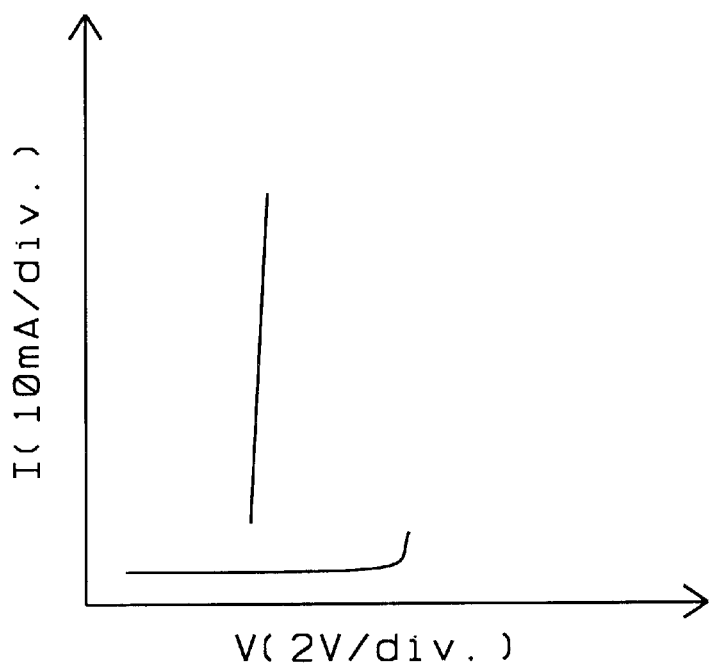

Moreover, FIGS. 14A and 14B show the I-V curves in the holding regions of the NCLSCR with different number of cascaded diodes at a temperature of 125° C., where the $V_G$ is biased at 0 Volts.

Figure 15:
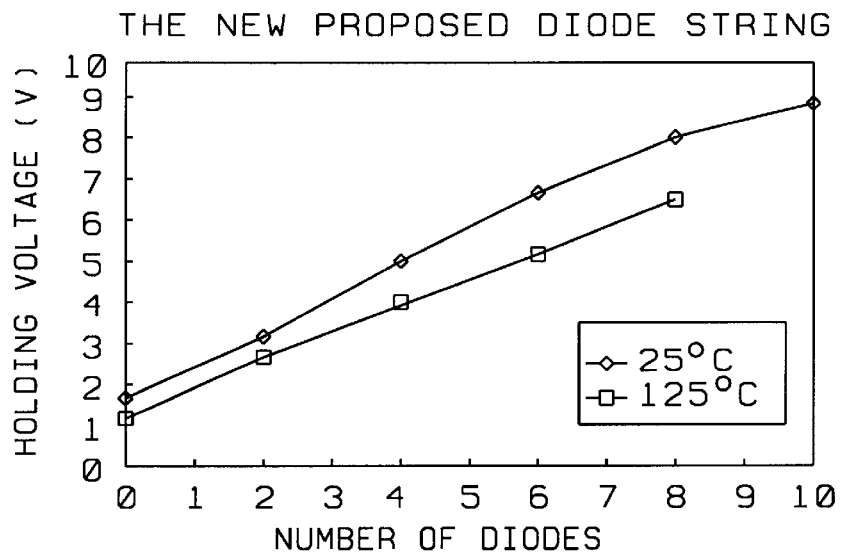
FIG. 15 is a graph showing the relation of the holding voltage of the NCLSCR device with different number of diodes at the temperatures of 25° C. and 125° C.

FIG. 15 shows the holding voltages of the NCLSCR with different numbers of diodes at the temperatures of 25° C. and 125° C. The diode string has a series NCLSCR. Therefore, the holding voltage is around 1 Volt in FIG. 15, while the number of diode is equal to zero in FIG. 15. The NCLSCR also contributes about I-V voltage block to the new diode string of this invention.

Figure 16:
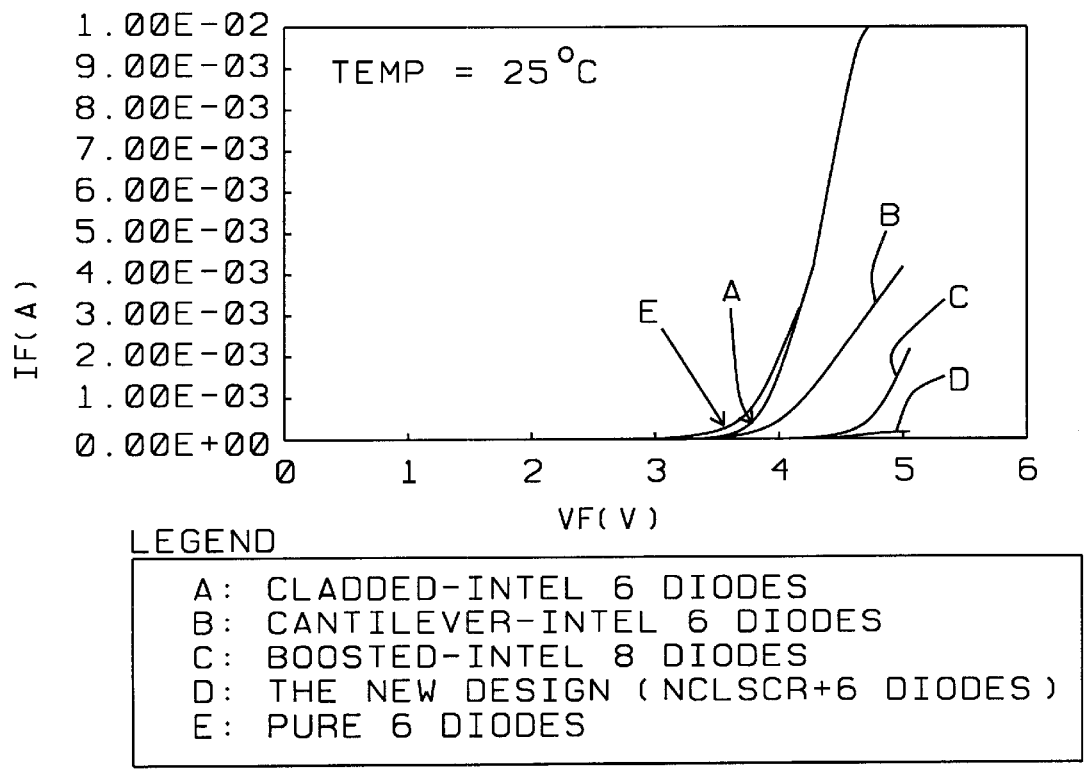
FIG. 16 is a graph showing the measured I-V curves of a diode string with different designs at the temperature of 25° C.

In FIG. 16, the measured I-V curves of the diode strings incorporated into different designs with six (6) or eight (8) cascaded diodes are compared, under the temperature of 25° C. The present invention (NCLSCR+6 diodes) has a very small current when the voltage bias is increased up to 5 Volts, but those previous designs by Intel have a large leakage current when the voltage bias is increased greater than 3 Volts.

Figure 17:
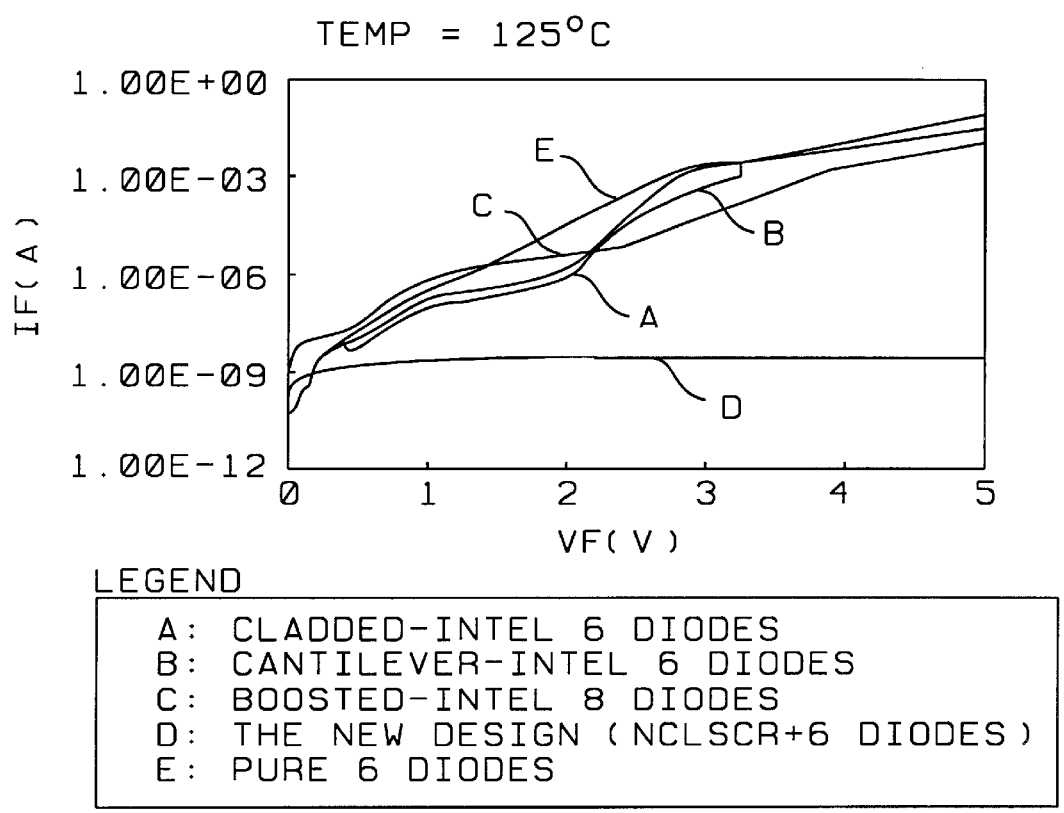
FIG. 17 is a graph showing the measured I-V curves of several different diodes strings with different designs at the temperature of 125° C. The y axis is drawn in the logarithmic scale.

In a high temperature of 125° C., the I-V curves of those designs are shown in FIG. 17, where the y-axis is drawn on a logarithmic scale to show the obvious difference between the previous designs and the present invention. As seen in FIG. 17, the present invention only has a slight increase on its leakage current when the bias voltage is increased to 5 Volts. On the contrary, the previous designs employed by Intel have a very obvious increase on their leakage current when the bias voltage is increased. This verifies the excellent performance of the present invention to reduce the leakage current on the diode string.

3.4.2 The Leakage Current

FIG. 18 shows the comparison on the leakage current of different diode string designs under 3.3 Volts and 5 Volts voltage biases at the temperature of 25° C.

The comparison on the leakage current of different diode string designs at the temperatures of 25° C. and 125° C. under a fixed 3.3 Volts voltage bias is shown in FIG. 19. The leakage current of the pure diode string with 6 cascaded diodes under the VDD bias of 3.3 Volts at the temperature of 25° C. (125° C.) is 12.45 $\mu$A (3.46 mA). The Cladded diode string with 6 diodes under the VDD bias of 3.3 Volts at the temperature of 25° C. (125° C.) is 3.51 $\mu$A (3.33 mA). The Boosted diode string with 8 diodes under the VDD bias of 3.3 Volts at the temperature of 25° C. (125° C.) is 44.03 $\mu$A (0.61 mA). The Cantilever diode string with 6 diodes under the VDD bias of 3.3 Volts at the temperature of 25° C. (125° C.) is 4.96 $\mu$A (1.25 mA). But, the present invention (low leakage diode string) on the diode string with an NCLSCR and 6 diodes under the VDD bias of 3.3 Volts at the temperature of 25° C. (125° C.) is only 31 pA (1.07 nA). With such a very low leakage current in the new diode string of this invention design, this new diode string is very suitable for applying in the ESD clamp circuit in the portable or low-power electronics products.

3.4.3 ESD Level

The fabricated diode strings with different designs are also tested by the Zapmaster ESD tester in the Human-Body-Model (HBM) ESD stresses. All of the tested circuits included the pure diode string, cladded diode string, boosted diode string, cantilever diode string. The new diode string of this invention can sustain the ESD stress of greater than 8 kV (8,000 Volts). The diode string in the forward-biased condition can sustain a high ESD level, due to its low operating voltage level in the forward-biased condition. The diode strings in the present invention with two to eight (2–8) cascaded diodes can sustain an ESD stress greater than 8 kV (8,000 Volts). This verifies that the method of the present invention can maintain the excellent ESD robustness of the diode string with only a very small leakage current from VDD to VSS.

3.4.4 Turn-on Verification

Figure 20:
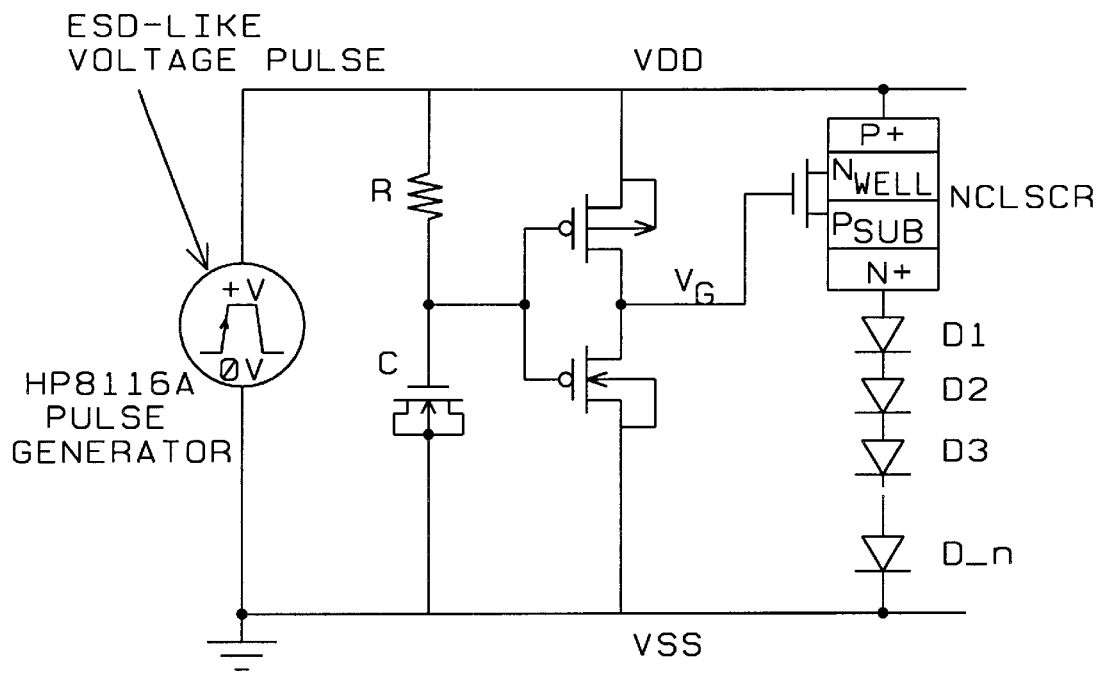
FIG. 20 shows a schematic diagram of an experimental circuit employed to verify the turn-on efficiency of the ESD clamp circuit of this invention between the power lines comprising power rail VDD and power rail VSS with a low-leakage diode string and an NCLSCR device during an ESD-stress condition.

A voltage pulse generated from a pulse generator (HP8118A) with a pulse height of 8 Volts and a rise time of about 10 ns is used to simulate the ESD pulse and applied to the VDD power line to verify the turn-on behavior of the new diode string design. The experimental setup is shown in FIG. 20.

Figure 21A:
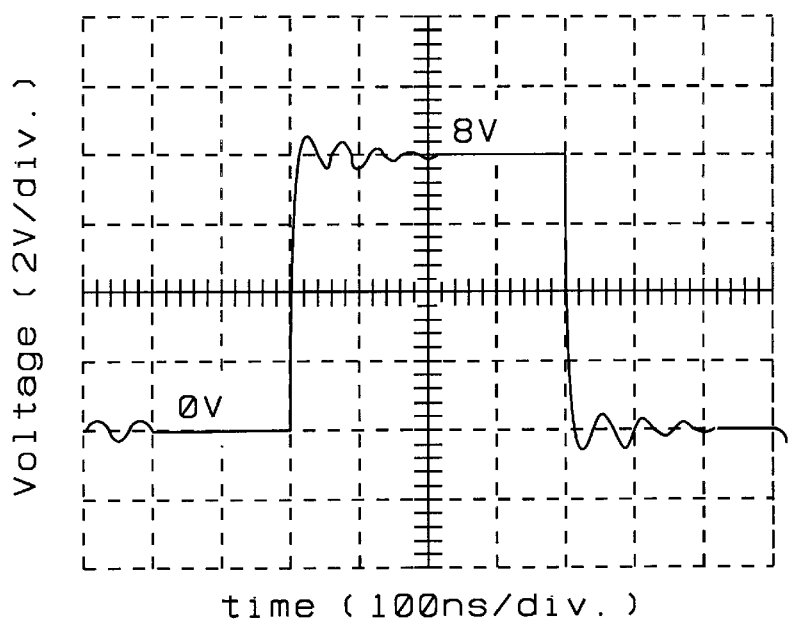
FIGS. 21A–21C show graphs of voltage waveforms.
Figure 21B:
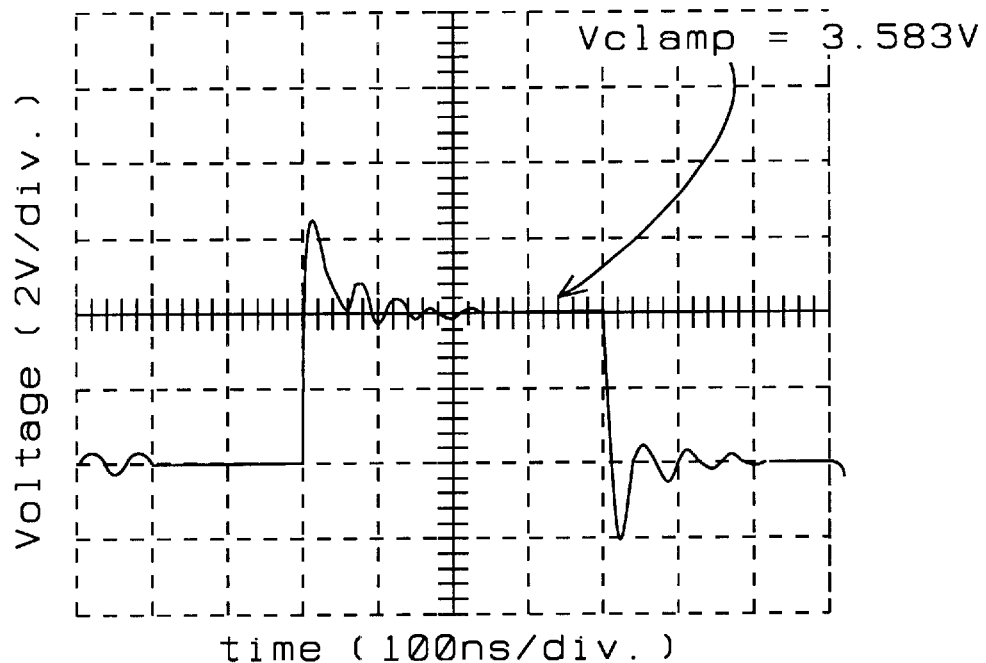
Figure 21C:
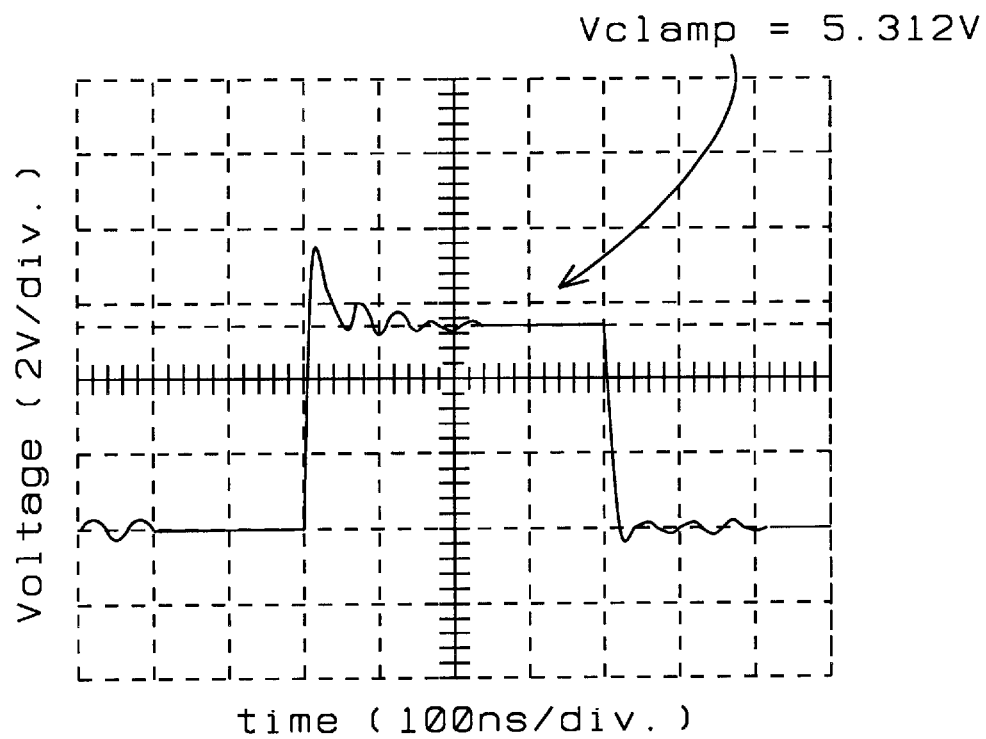

The measured results are shown in FIGS. 21A–21C. The original voltage waveform of the generated 0-to-8 Volts voltage pulse is shown in FIG. 21A. When this voltage pulse is applied to the VDD-to-VSS ESD clamp circuit, the diode string of the present invention can be quickly turned on to clamp the voltage level on the VDD power line.

The voltage waveform clamped by the diode string with an NCLSCR and 2 cascaded diodes is shown in FIG. 21B, where the voltage level on the VDD power line is limited to about 3.583 Volts with a time period about 20 ns to fully turn on the diode string.

The voltage waveform clamped by the diode string of this invention with an NCLSCR and four (4) cascaded diodes is shown in FIG. 21C with the voltage level on the VDD power line limited to about 5.312 Volts and a time period about 20 ns to fully turn on the diode string. This verifies that the ESD clamp circuit with the diode string of this invention can quickly provide an effective conduction path (the Path 2 in FIG. 3) to bypass the overstress ESD current across the VDD and VSS power rails during the ESD-stress condition.

When the IC is under the normal operating condition, the VDD is biased at 3 Volts and the VSS is biased at 0 Volts for the 3 Volts applications. But, the system-level noise pulses may couple to the VDD line of the IC to cause an overshooting voltage waveform on the VDD power line. The ESD clamp circuit for placing between the VDD and VSS power rails should be verified in such a condition to make sure that the ESD clamp circuit does not cause latchup danger between the power rails.

An experimental setup to verify this issue is shown in FIG. 22 which is based upon the circuit of FIG. 9. In FIG. 22 a 3 Volt-to-8 Volt voltage pulse +Vp is applied across power line VDD and ground line VSS. The voltage pulse +Vp has a rise time of –10 ns is used to simulate the overshooting noise on the power line VDD. Such an overshooting voltage pulse +Vp is applied to the VDD power line to verify the turn-on behavior of the ESD clamp circuit of the ESD detection Circuit EDC in FIG. 9 with the NMOS Controlled Lateral SCR (NCLSCR) and series connected diode string arrangement of FIGS. 9 and 22. The inverter circuit of FIG. 9 is shown in more detail with a PMOS transistor M6 and an NMOS transistor M7 having the gate electrodes thereof connected to the node Vx. A power supply voltage of three volts (3 Volts) is connected across the power line VDD and the ground line VSS. The device of FIG. 22 is identical to the device of FIG. 9 and the difference is simply that the inverter I is shown and described in detail.

Figure 23A:
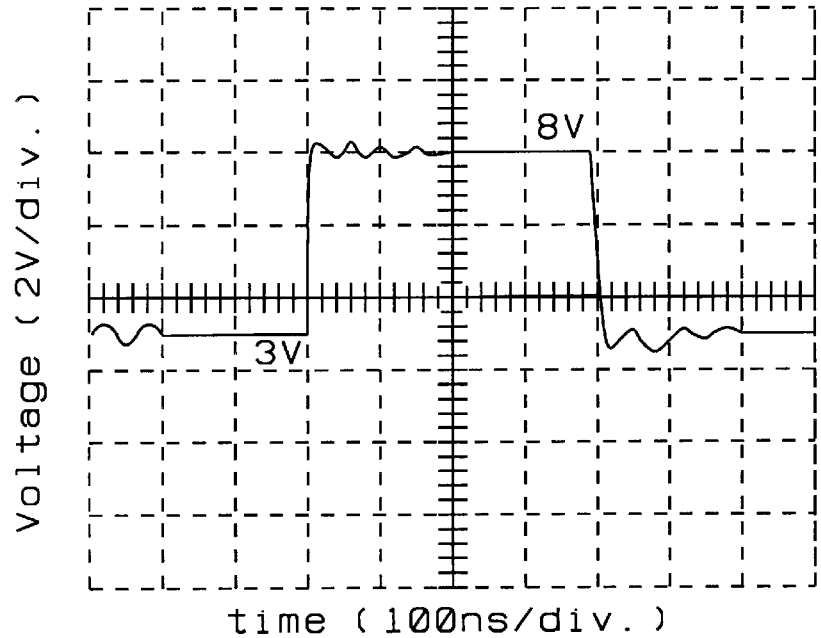
FIGS. 23A–23B show graphs of voltage waveforms.

The original voltage waveform of the generated 3 Volt-to-8 Volt voltage pulse with a pulse width of 400 ns to simulate the overshoot noise condition is shown in FIG. 23A. When this voltage pulse is applied to the ESD clamp circuit with the 3 Volts VDD bias, the diode string of this invention in the ESD clamp circuit can be quickly turned on to clamp the overshooting voltage pulse on the VDD power line. After the triggering of the overshooting voltage pulse, the diode string with a holding voltage greater than VDD can automatically turn itself off.

Figure 23B:
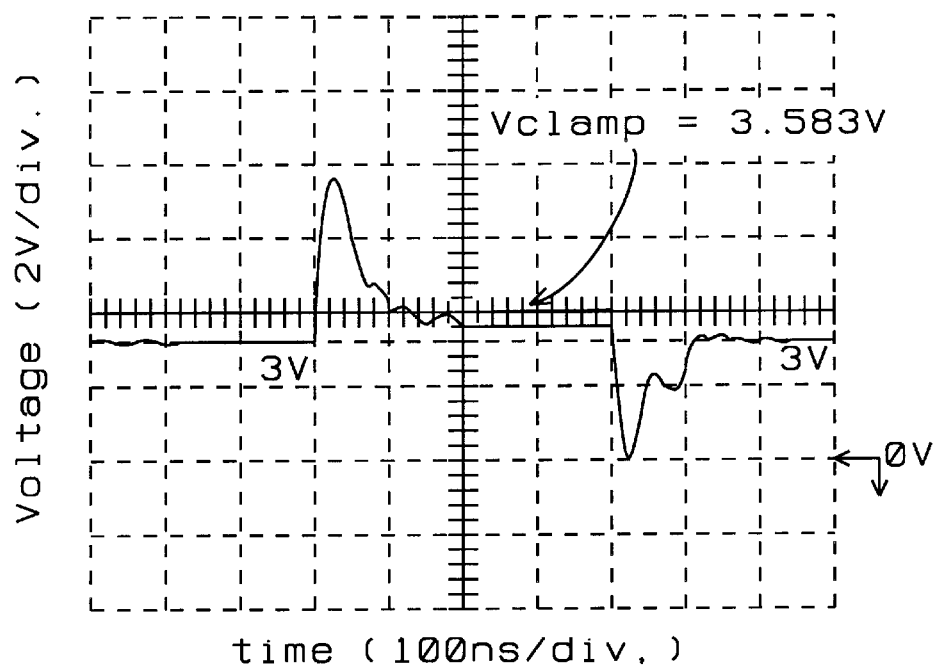

The voltage waveform clamped by the diode string of this invention with an NCLSCR and two (2) cascaded diodes is shown in FIG. 23B, where the voltage level on the VDD power line is limited to about 3.583 Volts.

In FIG. 23B, the VDD power line is restored to the 3 Volts voltage level after the triggering of the overshooting voltage pulse. This verifies that the diode string of this invention with NCLSCR device in the VDD-to-VSS ESD clamp circuit can clamp the overshooting voltage noise without causing latchup problem to the IC, when the IC is operating in the normal condition. The number of diodes used in the low-leakage diode string to form a VDD-to-VSS ESD clamp circuit is dependent on the VDD-VSS voltage difference. The total holding voltage of the diode string of this invention in the turn-on state should be designed to be greater than the VDD-VSS voltage difference in the CMOS IC.

4. Applications of the Low-Leakage Diode String

The diode string of this invention with an NCLSCR and multiple cascoded diodes has been experimentally proven to have a very low leakage current, as well as, to still keep the excellent ESD robustness of a diode string. Therefore, such a new diode string can be applied to the CMOS IC devices for ESD protection between the separated power rails.

4.1 Application Between the VDD and VSS Power Rails

Figure 24A:
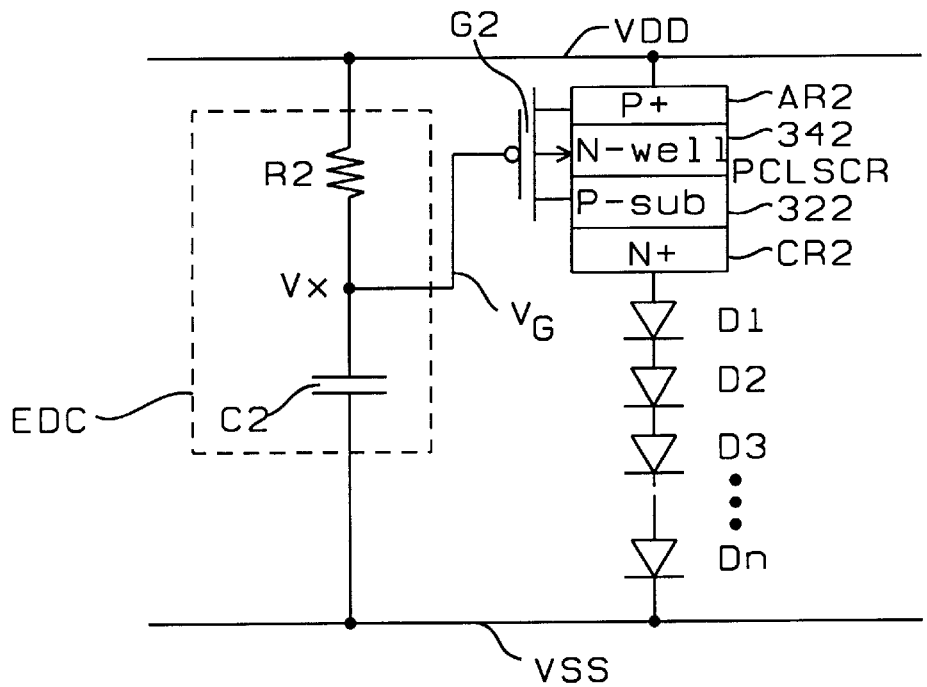
FIG. 24A shows a schematic diagram of a modified design on the diode string with a PMOS-controlled lateral SCR device (PCLSCR) for using in the VDD-to-VSS ESD clamp circuit.
Figure 24B:
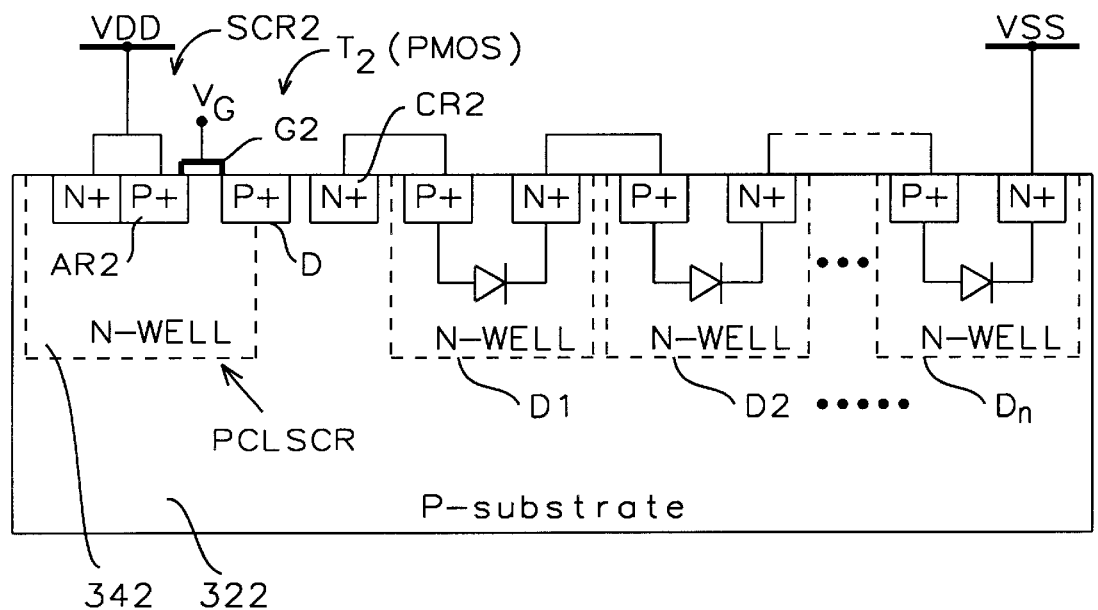
FIG. 24B. shows a cross-sectional view of the device of FIG. 24A with the PCLSCR device and the diode string.

FIG. 24A shows a modified schematic circuit diagram for a device in accordance with this invention for reducing the leakage current. The low-leakage diode string is shown in FIG. 24A, where a PMOS-Controlled Lateral SCR device (PCLSCR) is used to reduce the leakage current of the diode string. A cross-sectional view of the device with the diode string including the PCLSCR is shown in FIG. 24B. FIG. 24A includes power rails comprising a power line VDD and a ground line VSS. A pair of circuits is connected in parallel between the VDD power line and the VSS ground line. One circuit is an ESD-detection circuit EDC. The other circuit is an PMOS Controlled Lateral SCR (PCLSCR) device which is in series with a series connected diode string D1, D2 . . . Dn.

ESD-detection Circuit

The ESD-detection circuit EDC includes a resistor R2 connected between VDD and node Vx and a capacitor C2 connected between node Vx and ground voltage Vss.

Lateral SCR Device PCLSCR

The power line VDD is connected to the P+ anode region AR2 of one end of a lateral SCR device PCLSCR. The device PCLSCR includes the P+ anode region AR2 located in an N-well 342 in P-substrate 322 and a P+ drain region D seen in FIG. 24B of a PMOS FET T2 which straddles the N-well 342 and the P-substrate 322. The cathode CR2 of the device PCLSCR is formed by the N+ region in substrate 322 which is connected to the P+ anode of the proximal diode D1 of the diode string D1, D2 . . . Dn. Gate electrode G2 of the device PCLSCR is connected directly to the node Vx.

Series Connected Diode String

The series connected diode string D1, D2 . . . Dn is provided with the cathode CR2 of the device PCLSCR coupled to the anode of diode D1 which is at the inboard end of the diode string D1, D2 . . . Dn. The cathode of distal diode Dn is connected to ground potential VSS. The gate G2 of FET transistor T2 is connected to $V_G$ which in this case is a line connected to node Vx.

By using such a modification with the PCLSCR, the control circuit to turn on the diode string can be simplified to a simple RC delay circuit, as shown in FIG. 24A. The RC delay circuit also has a time constant of about 0.1 to about 1 μs to detect the ESD transition. In the normal operating condition with the VDD and VSS biases, the gate voltage of PCLSCR is biased at VDD voltage level, therefore the PCLSCR device is kept off in this situation. So, the leakage current from VDD to VSS through the PCLSCR and diode string is limited to the off-state leakage current of the PMOS, which is inserted in the PCLSCR device. The PMOS in its off state has a very small leakage current as that of an NMOS, therefore such modified design on the diode string with the PCLSCR still has a very small (about nA) leakage current. The diode string of this invention with the NCLSCR can be also controlled by the gate-coupled technique to form an ESD clamp circuit between the VDD and VSS power rails.

Figure 25:
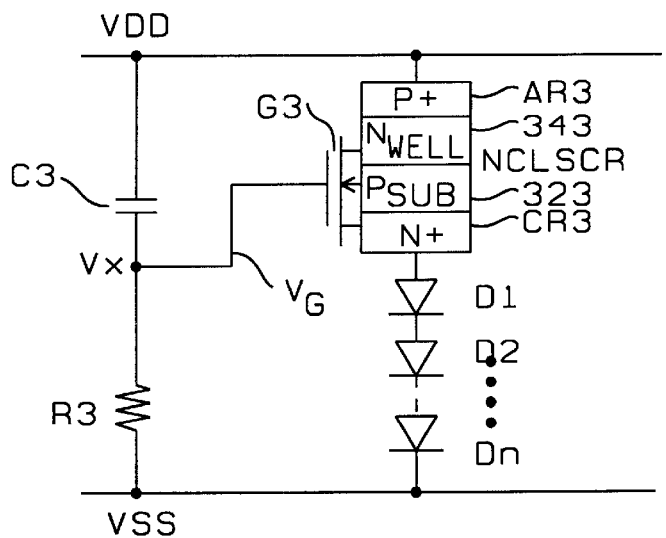
FIG. 25 shows a schematic diagram of a modified design of the VDD-to-VSS ESD clamp circuit by using the NCLSCR device with a diode string, which is trigged on by a gate-coupling technique.

FIG. 25 shows a schematic circuit diagram of a device in accordance with this invention for reducing the leakage current. The circuit of FIG. 25 includes power rails comprising a power line VDD and a ground line VSS. A pair of Circuits are connected in parallel between the VDD power line and the VSS ground line. One circuit is an ESD-detection circuit EDC. The other circuit is an NMOS Controlled Lateral SCR (NCLSCR) device which is in series with a series connected diode string D1, D2 . . . Dn.

ESD-detection Circuit

The ESD-detection circuit EDC includes a capacitor C3 connected between VDD and node Vx and a resistor R3 connected between node Vx and ground voltage Vss.

Lateral SCR Device NCLSCR

The power line VDD is connected to the P+ anode region AR3 of one end of a lateral SCR device NCLSCR. The device NCLSCR includes the P+ anode region AR3 located in an N-well 343 in P-substrate 323 and an N+ drain region (not shown) of a NMOS FET which straddles the N-well 343 and the P-substrate 323 (as in FIG. 6). The N+ doped cathode of the device NCLSCR is located in the P-substrate 323 juxtaposed with the N+ region in substrate 323 which is connected to the P+ anode of the proximal diode D1 of the diode string D1, D2 . . . Dn. The gate electrode G3 of the device NCLSCR is connected directly to the node Vx.

Series Connected Diode String

The series connected diode string D1, D2 . . . Dn is provided with the cathode of the device NCLSCR coupled to the anode of diode D1 which is at the inboard end of the diode string D1, D2 . . . Dn. The cathode of distal diode Dn is connected to ground potential VSS. The gate G3 of FET transistor T2 is connected to $V_G$ which in this case is a line connected to node Vx.

In FIG. 25, the ESD voltage pulse happens across the VDD and VSS power rails, the gate of NMOS in the NCLSCR is coupled with a voltage from the fast-transient ESD voltage pulse. Therefore, the NCLSCR can be simultaneously turned on by the ESD pulse on the VDD power line to bypass the ESD current from VDD to VSS. When a CMOS IC has multiple VDD power supplies, such as 3.3 Volts and 5 Volts, the ESD clamp circuits with the diode string of this invention for using in such situation are shown in FIG. 26, FIG. 27, and FIG. 28.

Figure 26:
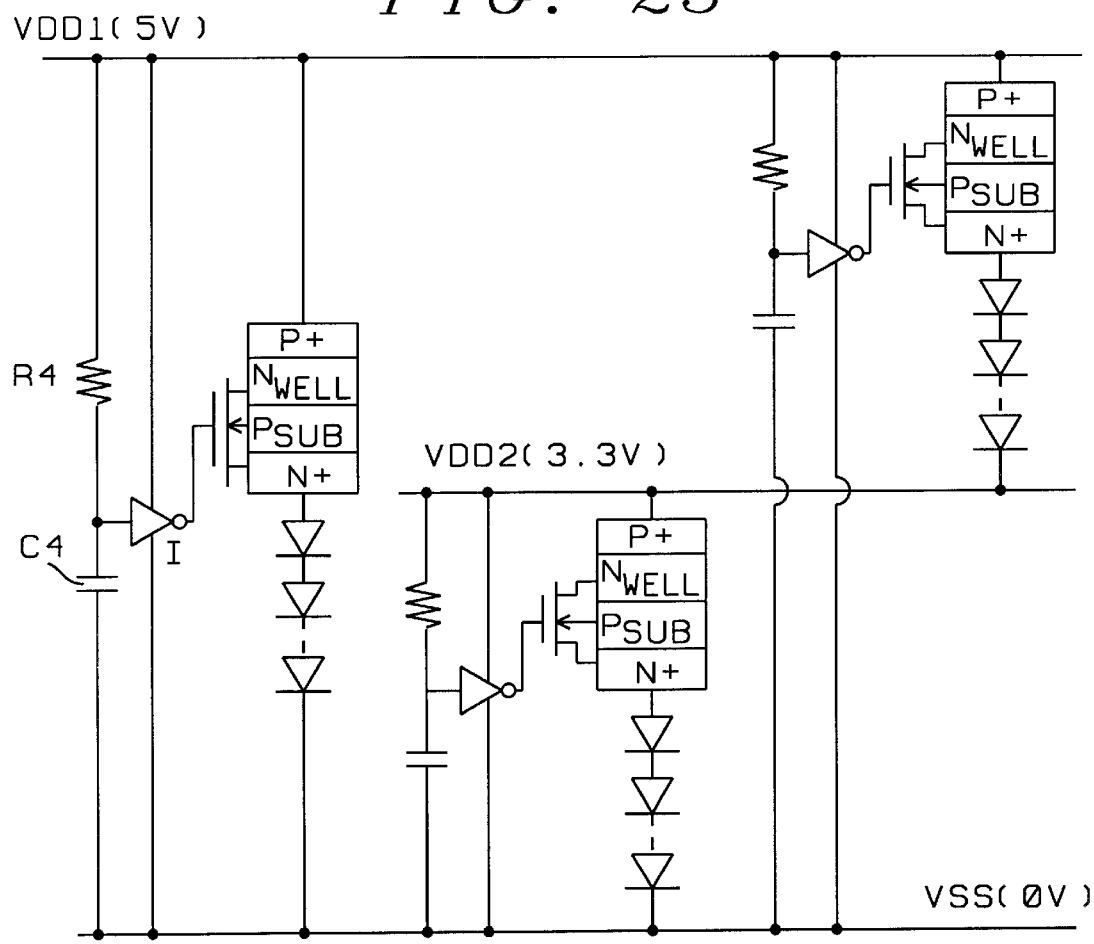
FIG. 26 shows a schematic diagram of an application in accordance with this invention of a diode string with an NCLSCR device for using in the ESD clamp circuits between different power rails, which have different voltage levels in a CMOS IC.

In FIG. 26, three diode strings with the NCLSCR and their corresponding control circuits are placed among the VDD1, VDD2, and VSS to achieve a whole-chip ESD protection scheme.

Figure 27:
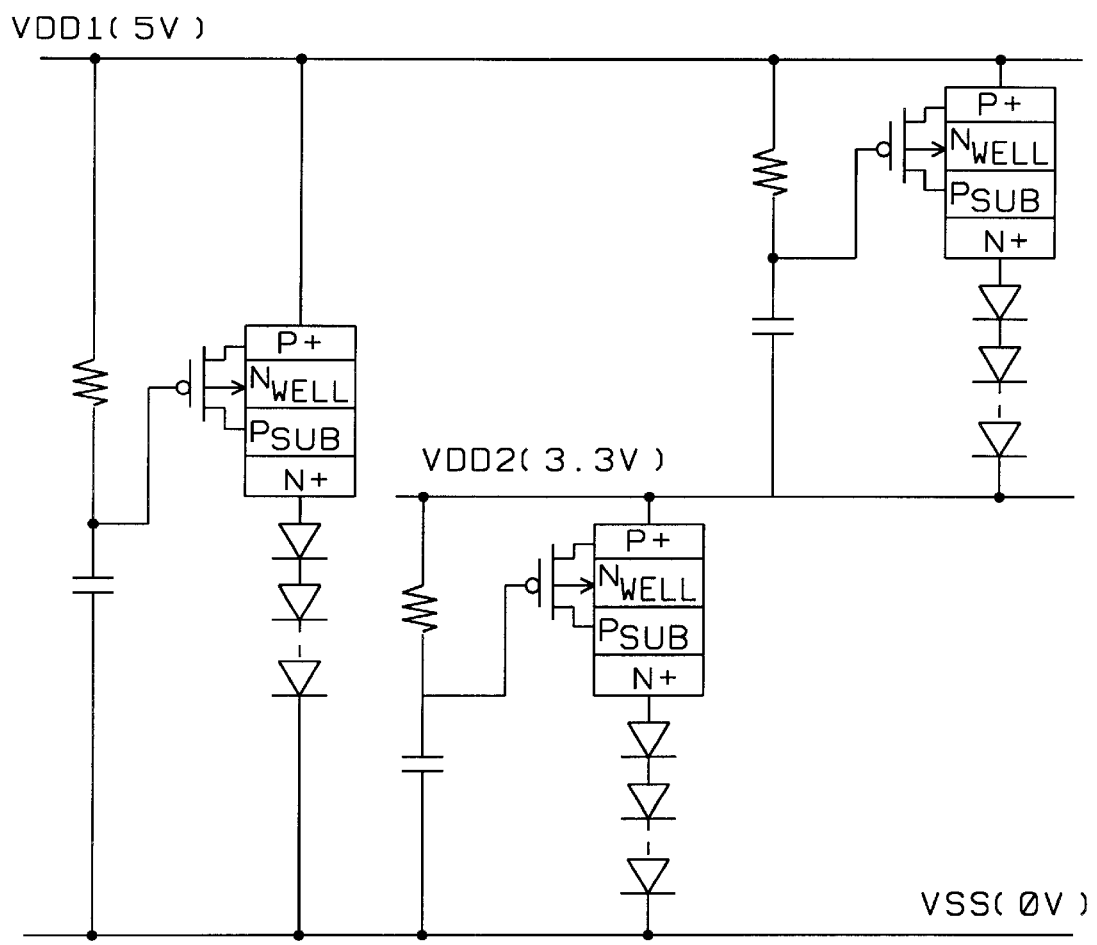
FIG. 27 shows a schematic diagram of an application of the diode string of this invention with a PCLSCR device for using in the ESD clamp circuits between different power rails, which have different voltage levels in a CMOS IC.

In FIG. 27, three diode strings with the PCLSCR and their corresponding control circuits are placed among the VDD1, VDD2, and VSS to achieve a whole-chip ESD protection scheme.

Figure 28:
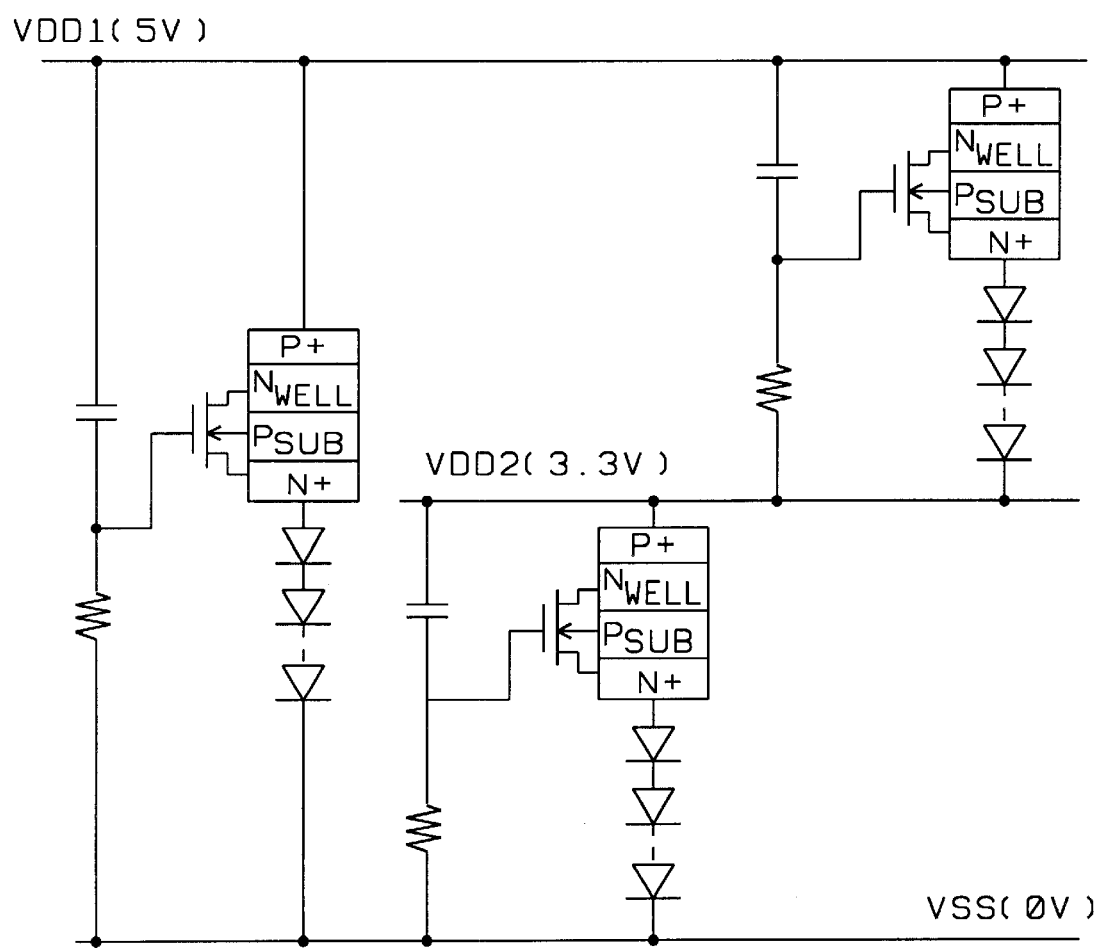
FIG. 28 shows a schematic diagram of a modified application of a diode string with a NCLSCR device in accordance with this invention, for using in the ESD clamp circuits between different power rails, which have different voltage levels in a CMOS IC.

In FIG. 28, three diode strings with the NCLSCR and the gate-coupled control circuits are placed among the VDD1, VDD2, and VSS to achieve a whole-chip ESD protection scheme.

4.2 Application Between the Separated Power Pins

One of the ESD protection scheme is to add the ESD-connection cell between the separated VDD power rails in a CMOS IC to avoid the ESD damage located in the internal circuits [3]. But, when the separated power rails have different voltage levels, such as 3.3 Volts and 5 Volts, the bi-directional back-to-back diodes are not suitable in this situation. Therefore, the diode string of this invention with the NCLSCR or PCLSCR can be used in this situation.

Figure 29A:
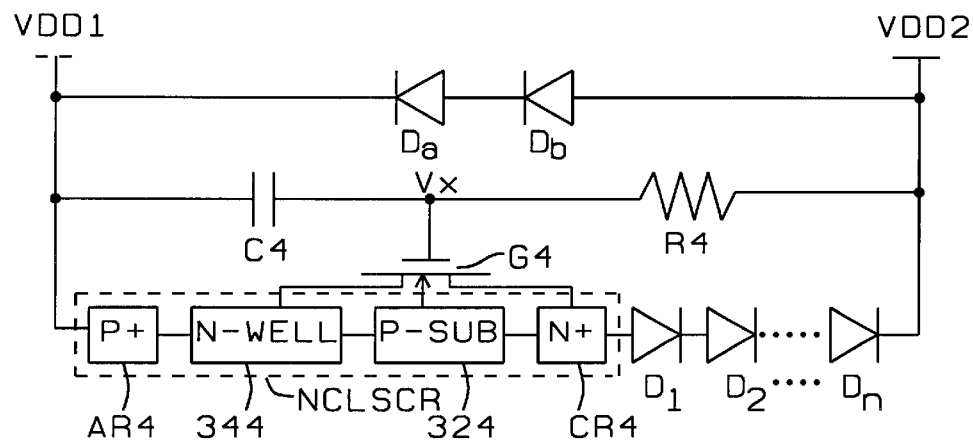
FIGS. 29A and 29B show schematic diagrams of modified diode strings in accordance with this invention, for using in the ESD clamp circuit between different power lines comprising VDD power rails, where the voltage level of the power rail VDD1 exceeds that of power rail VDD2.
Figure 29B:
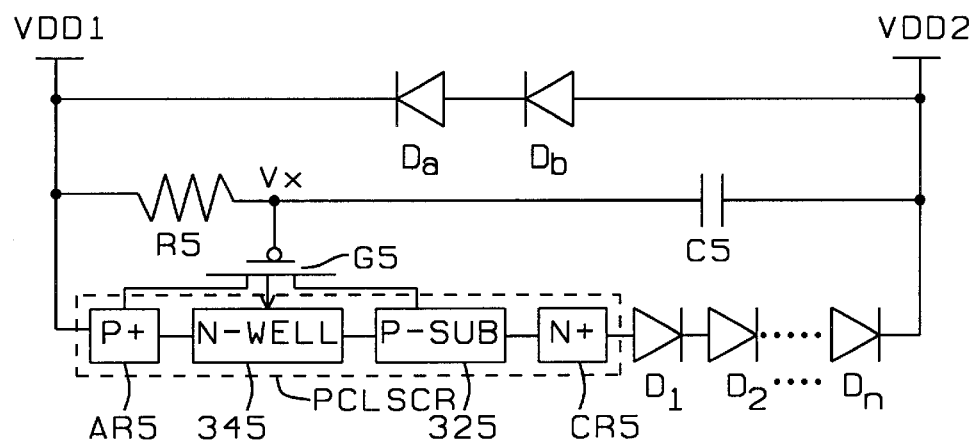

The typical applications with the gate-coupled control circuit are shown in FIG. 29A and FIG. 29B, where the voltage level of VDD1 is greater than that of VDD2.

VDD1/VDD2–NCLSCR

FIG. 29A shows a schematic circuit diagram of a device in accordance with this invention for reducing the leakage current. The circuit of FIG. 29A includes power rails comprising a power line VDD1 and another power line VDD2. A set of three circuits is connected in parallel between the VDD1 power line and the VDD2 power line.

One circuit is an ESD-detection circuit EDC.

The second circuit is an NMOS Controlled Lateral SCR (NCLSCR) device which is in series with a series connected diode string D1, D2 . . . Dn.

The third circuit is a reverse diode circuit comprising multiple diodes Da and Db connected in series in the reverse direction from the diode string D1, D2 . . . Dn.

ESD-detection Circuit

The ESD-detection circuit EDC includes a capacitor C4 connected between a first power rail VDD1 and node Vx and a resistor R4 connected between node Vx and a second power rail VDD2.

Lateral SCR Device NCLSCR

The power line VDD1 is connected to the P+ anode region AR4 of one end of the device NCLSCR. Device NCLSCR includes the P+ anode region AR4 located in an N-well 344 in P-substrate 324 and an N+ drain region (not shown) of a NMOS FET which straddles the N-well 344 and the P-substrate 324 (as in FIG. 6). The N+ doped cathode CR4 of device NCLSCR is connected to the P+ anode of the proximal diode D1 of the diode string D1, D2 . . . Dn. The gate electrode G4 of the device NCLSCR is connected directly to the node Vx.

Series Connected Diode String

The series connected diode string D1, D2 . . . Dn is provided with the cathode CR4 of device NCLSCR coupled to the anode of diode D1 which is at the inboard end of the diode string D1, D2 . . . Dn. The cathode of distal diode Dn is connected to the VDD2 line. The gate G4 of the NMOS FET transistor is connected to $V_G$ which is a line connected to node Vx.

Reverse Diode Circuit

The reverse diode circuit comprising multiple diodes Da and Db connected in series in the reverse direction from the diode string D1, D2 . . . Dn with the cathode of diode Da connected to the first power rail VDD1, with the anode of the diode Da connected to the cathode of diode Db. The anode of the second diode Db is connected to the second power rail VDD2. This reverse diode can comprise three (3) diodes or more and this invention is not limited to two diodes for this purpose.

VDD1/VDD2-PCLSCR

FIG. 29B shows a schematic circuit diagram of a device in accordance with this invention for reducing the leakage current. The circuit of FIG. 29B includes power rails comprising a power line VDD1 and another power line VDD2. The voltage level of VDD1 is greater than or equal to the voltage level of VDD2. A set of three circuits is connected in parallel between the VDD1 power line and the VDD2 power line.

One circuit is an ESD-detection circuit EDC.

The second circuit is an PMOS Controlled Lateral SCR (PCLSCR) device which is in series with a series connected diode string D1, D2 . . . Dn.

The third circuit is a reverse diode circuit comprising a multiplicity of diodes Da and Db connected in series in the reverse direction from the diode string D1, D2 . . . Dn.

ESD-detection Circuit

The ESD-detection circuit EDC includes a resistor R5 connected between a first power rail VDD1 and node Vx and a capacitor C5 connected between node Vx and a second power rail VDD2.

Lateral SCR Device PCLSCR

The power line VDD1 is connected to the P+ anode region AR5 of one end of a lateral SCR device PCLSCR. The device PCLSCR includes the P+ anode region AR5 located in an N-well 345 in P-substrate 325 and an N+ drain region (not shown) of a PMOS FET which straddles the N-well 345 and the P-substrate 325 (as in FIG. 24B). The cathode CR5 of the device PCLSCR is connected to the P+ anode of the proximal diode D1 of the diode string D1, D2 . . . Dn. The gate electrode G5 of the device PCLSCR is connected directly to the node Vx.

Series Connected Diode String

The series connected diode string D1, D2 . . . Dn is provided with the cathode CR5 of device PCLSCR coupled to the anode of diode D1 which is at the inboard end of the diode string D1, D2 . . . Dn. The cathode of distal diode Dn is connected to ground potential VSS. The gate G5 of the PMOS FET transistor is connected to $V_G$ which in this case is a line connected to node Vx.

Reverse Diode Circuit

The reverse diode circuit comprising a multiplicity of diodes Da and Db connected in series in the reverse direction from the diode string D1, D2 . . . Dn with the cathode of diode Da connected to the first power rail VDD1, with the anode of the diode Da connected to the cathode of diode Db. The anode of the second diode Db is connected to the second power rail VDD2. This reverse diode circuit can comprise three (3) diodes or more and this invention is not limited to two diodes for this purpose.

Figure 30:
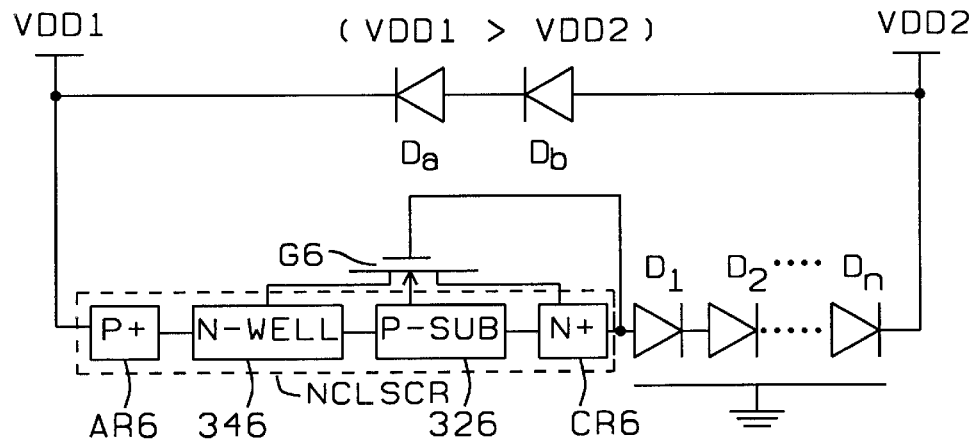
FIG. 30 shows a diode string with an NCLSCR device in accordance with this invention, for use in the ESD clamp circuit between different power rails VDD, where the voltage level of power rail VDD1 is greater than that of power rail VDD2.

FIG. 30 shows a modified design to use the NMOS in its drain-breakdown condition to trigger on the diode string with the NCLSCR.

VDD1>VDD2-NCLSCR

FIG. 30 shows a schematic circuit diagram of a device in accordance with this invention for reducing the leakage current. The circuit of FIG. 30 includes power rails comprising a power line VDD1 and another power line VDD2. A set of two circuits is connected in parallel between the VDD1 power line and the VDD2 power line where the voltage on VDD1 exceeds the voltage on power rail VDD2.

A first circuit is a NMOS Controlled Lateral SCR (NCLSCR) device which is in series with a series connected diode string D1, D2 . . . Dn.

A second circuit is a reverse diode circuit comprising a multiplicity of diodes Da and Db connected in series in the reverse direction from the diode string D1, D2 . . . Dn.

Lateral SCR Device NCLSCR

The power line VDD1 is connected to the P+ anode region AR6 of one end of a device NCLSCR. The device NCLSCR includes the P+ anode region AR6 located in an N-well 345 in P-substrate 325 and an N+ drain region (not shown) of a NMOS FET which straddles the N-well 345 and the P-substrate 325 (as in FIG. 6). The cathode CR6 of the device NCLSCR is connected to the P+ anode of the proximal diode D1 of the diode string D1, D2 . . . Dn. The gate electrode G5 of the device NCLSCR is connected directly to the node Vx.

Series Connected Diode String

The series connected diode string D1, D2 . . . Dn is provided with the cathode CR6 of the device NCLSCR coupled to the anode of diode D1 which is at the inboard end of the diode string D1, D2 . . . Dn. The cathode of distal diode Dn is connected to the line VDD2. The gate G6 of the NMOS FET transistor is connected to $V_G$ which in this case is a line connected to node Vx.

Reverse Diode Circuit

The reverse diode circuit comprising a multiplicity of diodes Da and Db connected in series in the reverse direction from the diode string D1, D2 . . . Dn with the cathode of diode Da connected to the first power rail VDD1, with the anode of the diode Da connected to the cathode of diode Db. The anode of the second diode Db is connected to the second power rail VDD2.

Figure 31:
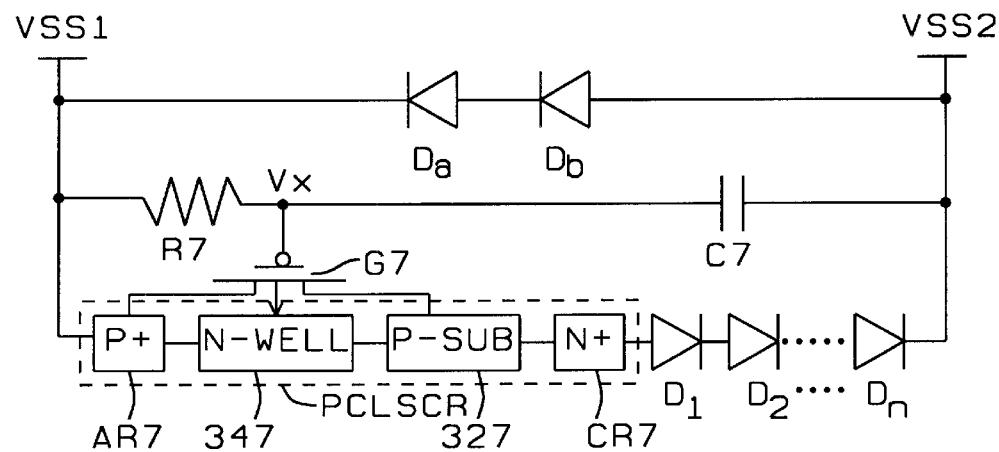
FIG. 31 shows a diode string with a PCLSCR device in accordance kilo with this invention, for use in the ESD clamp circuit between different power rails VSS to provide an ESD-current conducting path between the separated power lines VSS1 and VSS2 in a CMOS IC.

FIG. 31 shows a modified application of the diode string with the PCLSCR for using in the ESD clamp circuit between the different VSS power rails to provide the ESD-current conducting path between the separated VSS power rails in a CMOS IC. FIG. 31 shows a schematic circuit diagram of a device in accordance with this invention for reducing the leakage current. The circuit of FIG. 31 includes power rails comprising a set of three circuits is connected in parallel between the VSS1 power line and the VSS2 power line. One circuit is an ESD-detection circuit EDC. The second circuit is a PMOS Controlled Lateral SCR (PCLSCR) device which is in series with a series connected diode string D1, D2 . . . Dn. The third circuit is a reverse diode circuit comprising a multiplicity of diodes Da and Db connected in series in the reverse direction from the diode string D1, D2 . . . Dn.

ESD-detection Circuit

The ESD-detection circuit EDC includes a resistor R7 connected between a first power rail VSS1 and node Vx and a capacitor C7 connected between node Vx and a second power rail VSS2.

Lateral SCR Device PCLSCR

The power rail VSS1 is connected to the P+ anode region AR7 of one end of a lateral SCR device PCLSCR. The device PCLSCR includes the P+ anode region AR7 located in an P-well 347 in P-substrate 327 and an N+ drain region (not shown) of a PMOS FET which straddles the N-well 347 and the P-substrate 327 (as in FIG. 24B). The cathode CR7 of device PCLSCR is connected to the P+ anode of the proximal diode D1 of the diode string D1, D2 . . . Dn. Gate electrode G7 of device PCLSCR is connected directly to the node Vx.

Series Connected Diode String

The series connected diode string D1, D2 . . . Dn is provided with the cathode CR7 of device PCLSCR coupled to the anode of diode D1 at the inboard end of the diode string D1, D2 . . . Dn. The cathode of distal diode Dn connects to ground potential VSS2. The gate G7 of the PMOS FET transistor is connected to $V_G$ which is a line connected to node Vx.

Reverse Diode Circuit

The reverse diode circuit comprising a multiplicity of diodes Da and Db connected in series in the reverse direction from the diode string D1, D2 . . . Dn with the cathode of diode Da connected to the first power rail VSS1, with the anode of the diode Da connected to the cathode of diode Db. The anode of the second diode Db is connected to the second power rail VSS2.

Moreover, this diode string with PCLSCR or NCLSCR can be also applied in the ESD clamp, circuit between the separated VSS power rails. The typical application example is shown in FIG. 31. The ESD clamp circuit placed between the VSS1 and VSS2 provides the ESD current path between the separated VSS power rails to avoid the unexpected ESD damage located in the internal circuits. The design of FIG. 31 is also a part of whole-chip ESD protection scheme.

This invention (low leakage diode string) can also be applied to the input or output pad ESD protection circuit (not shown) to bypass the overstress ESD voltage on the input or output pad.

Figure 32A:
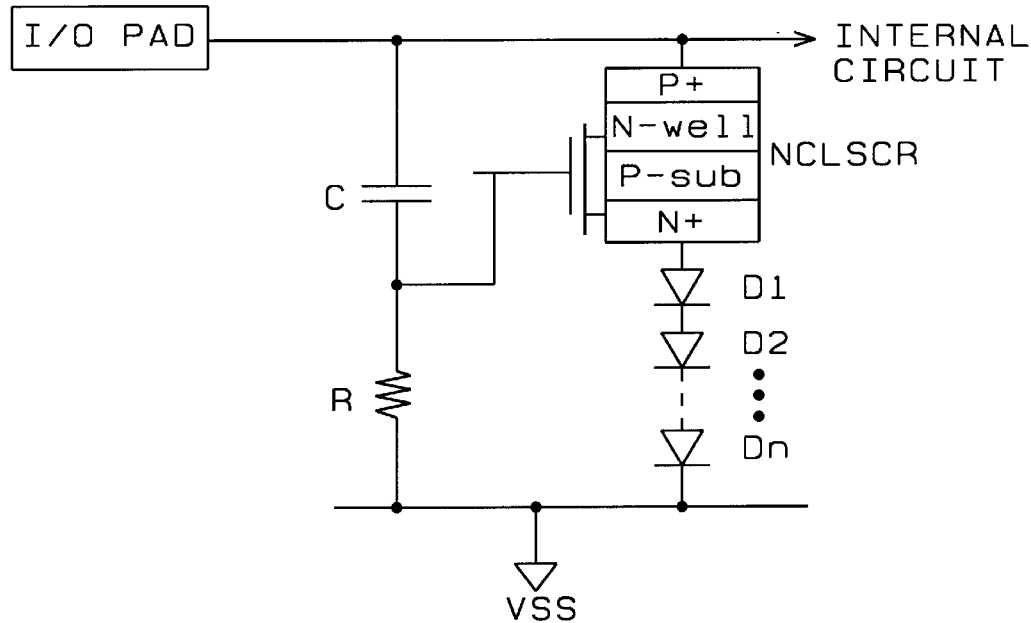
FIGS. 32A to 32C show the schematic diagrams of modified designs of this invention for use in input/output ESD protection circuits.
Figure 32B:
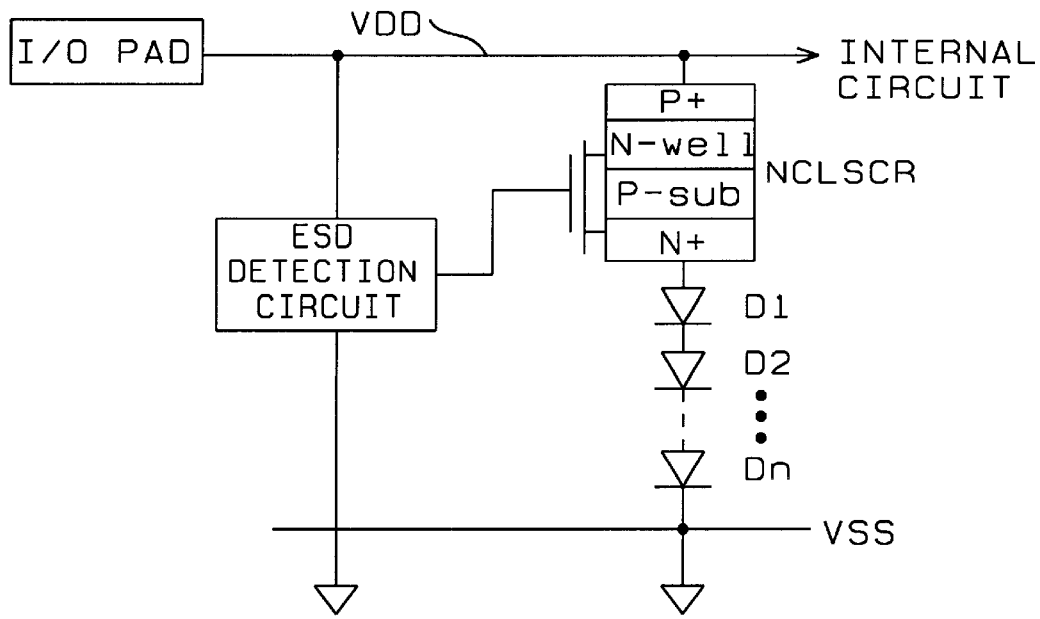
Figure 32C:
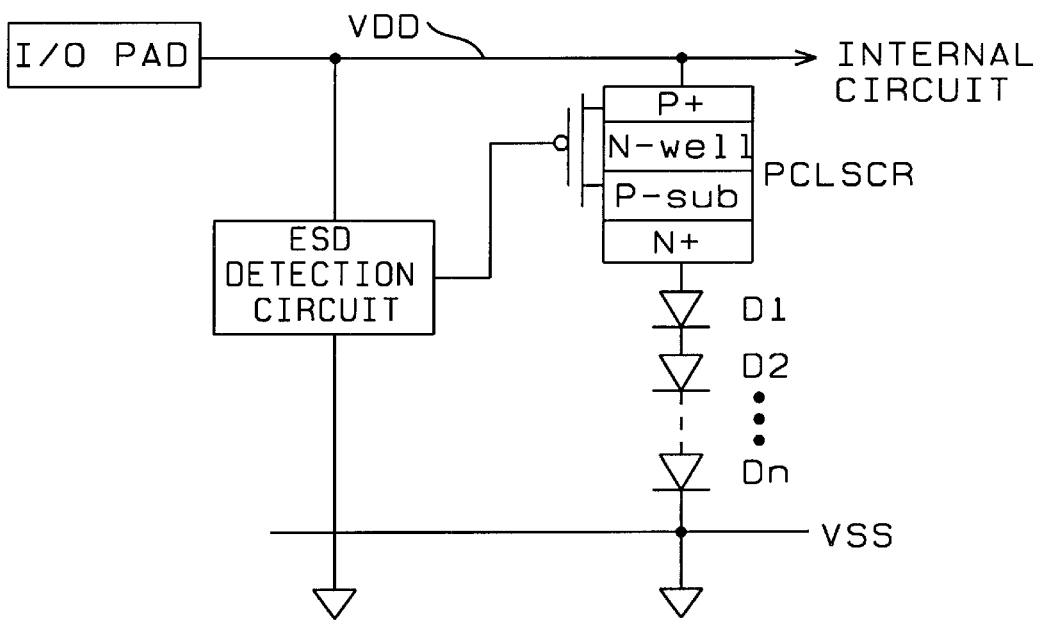

FIGS. 32A–32C illustrate the application of this invention to the low-leakage diode string in the I/O ESD protection circuit.

References

[1] C. Duvvury, R. N. Rountree, and O. Adams, "Internal chips ESD phenomena beyond the protection circuit," IEEE Trans. on Electron Devices, vol. 35, pp. 2133–2139 (1988).

[2] C.-N. Wu, M.-D. Ker, L.-J. Lui, S.-Y. Yeh, T.-L. Yu, S.-T. Lin, K.-L. Young,. and K.-Y. Chiu, "Unexpected ESD damage on internal circuits of sub-$\mu$m CMOS technology," Proc. of Int. Electron Devices Materials Symp., pp. 143–146 (1996).

[3] M.-D. Ker and T.-L. Yu, "ESD protection to overcome internal gate-oxide damage on digital-analog interface of mixed-mode CMOS IC's," Microelectronics Reliability, vol. 36, pp. 1727–1730 (1996).

[4] H. Terletzki, W. Nikutta, and W. Reczek, "Influence of the series resistance of on-chip power supply buses on internal device failure after ESD stress," IEEE Trans. on Electron Devices, vol. 40, pp. 2081–2083 (1993).

[5] C. C. Johnson, T. J. Maloney, and S. Qawami, "Two unusual HBM ESD failure mechanisms on a mature CMOS process," Proc. of EOS/ESD Symp. (1993), pp. 225–231.

[6] M. Chaine, S. Smith, and A. Bui, "Unique ESD failure mechanisms during negative to $V_{CC}$ HBM tests," Proc. of EOS/ESD Symp., pp. 346–355 (1997).

[7] EOS/ESD Standard for ESD Sensitivity Testing, EOS/ESD Association, Inc., New York (1998) (new version)

[8] C. Cook and S. Daniel, "Characterization of new failure mechanisms arising from power-pin ESD stressing," Proc. of EOS/ESD Symp., pp. 149–156 (1993).

[9] X. Guggenmos and R. Holzner, "A new ESD protection concept for VLSI CMOS circuits avoiding circuits stress," Proc. of EOS/ESD Symp., pp 74–82 (1991).

[10] N. Maene, J. Vandenbroeck, and L. V. D. Bempt, "On-chip electrostatic discharge protections for inputs, outputs, and supplies of CMOS circuits," Proc. of EOS/ESD Symp., pp 228–233 (1992).

[11] M.-D. Ker, C.-Y. Wu, H.-H. Chang, and T.-S. Wu, "Whole-chip ESD protection scheme for CMOS mixed-mode IC's in deep-submicron CMOS technology," Proc. of IEEE Custom Integrated Circuits Conference, pp. 31–34 (1997).

[12] S. H. Voldman and G. Gerosa, "Mixed-voltage interface ESD protection circuits for advanced microprocessors in shallow trench and LOCOS isolation CMOS technologies," IEDM Tech. Dig., pp. 227–280 (1994).

[13] S. Dabral, R. Aslett, and T. Maloney, "Designing on-chip power supply coupling diodes for ESD protection and noise immunity," Proc. of EOS/ESD Symp., pp 239–249 (1993).

[14] S. Dabral, R. Aslett, and T. Maloney, "Core clamps for low voltage technologies," Proc. of EOS/ESD Symp., pp 141–149 (1994).

[15] T. Maloney and S. Dabral, "Novel clamp circuits for IC power supply protection," Proc. of EOS/ESD Symp., pp. 1–12 (1995).

[16] M.-D. Ker, "Whole-chip ESD protection design with efficient VDD-to-VSS ESD clamp circuits for submicron CMOS VLSI," IEEE Trans. on Electron Devices, vol. 46, pp. 173–183 (1999).

[17] T. Maloney, "Electrostatic discharge protection circuits using biased and terminated PNP transistor chains," U.S. Pat. No. 5,530,612 (June 1996).

[18] M.-D. Ker, C.-Y Wu, and et al., "Whole-chip ESD protection for CMOS VLSI/ULSI with multiple power pins," Proc. of IEEE International Integrated Reliability Workshop, pp. 124–128 (1994).

[19] A. Chatterjee and T. Polgreen, "A low-voltage triggering SCR for on-chip ESD protection at output and input pads," Proc. of Symposium on VLSI Technology, pp. 75–76 (1990).

[20] M.-D. Ker, C.-Y. Wu, et al., "Complementary-LVTSCR ESD protection scheme for submicron CMOS IC's," Proc. of IEEE International Symposium on Circuits and Systems pp. 833–836 (1995).

[21] Electromagnetic compatibility for industrial-process measurement and control equipment, International Standard IEC 1000-4-2. (1995) (new version).

[22] J. Maas and D. Skjeie, "Testing electronic products for susceptibility to electrostatic discharge," 1990 EOS/ESD Symp. Proc., EOS-12, pp. 92–96.

[23] W. T. Rhoades, "ESD stress on IC's in equipment," EOS/ESD Symp. Proc., EOS-12, pp. 82–91 (1990).

[24] E. Chwastek, "A new method for assessing the susceptibility of CMOS integrated circuits to latch-up: the system-transient technique," EOS/ESD Symp. Proc., EOS-11, pp. 149–155 (1989).

[25] R. Lewis and J. Minor, "Simulation of a system level transient-induced latchup event," EOS/ESD Symp. Proc., EOS-16, pp. 193–199 (1994).

[26] G. Weiss and D. Young, "Transient-induced latchup testing of CMOS integrated circuits," EOS/ESD Symp. Proc., EOS-17, pp. 194–198 (1995).

[27] M. Corsi, R. Nimmo, and F. Fattori, "ESD protection of BiCMOS integrated circuits which need to operate in the harsh environments of automotive or industrial," EOS/ESD Symp. Proc., EOS-15, pp. 209–213 (1993).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An ESD protection circuit for an integrated circuit device comprising:
   a power supply line and a ground line,
   an electrostatic discharge detection (ESDD) circuit connected across the power supply line VDD and the ground line VSS having an ESDD output,
   a single CMOS Controlled Lateral SCR (CLSCR) device having a gate electrode and a P+ region and an N+ region with the gate electrode connected to the ESDD output,
   a diode string comprising a plurality of diodes each having an anode and a cathode connected in series with a proximal diode and a distal diode,
   the P+ region of the single CLSCR connected to the power supply line VDD,
   the N+ region of the single CLSCR connected to the proximal diode, and
   the distal diode connected to the ground line VSS.

2. The device of claim 1 wherein:
   the ESDD circuit includes as follows:
      a resistor and a capacitor having a junction therebetween connected in series between the power supply line and the ground line, and
      an inverter circuit having as follows:
         1) an input connected to the junction between the resistor and the capacitor, and
         2) an output connected to the ESDD output.

3. The device of claim 1 wherein:
   the CMOS Controlled Lateral SCR device comprises a PMOS Controlled Lateral SCR (PCLSCR), and
   the ESDD circuit includes as follows:
      a resistor and a capacitor having a junction therebetween connected in series between the power supply line and the ground line, and
      an inverter circuit having as follows:
         1) an input connected to the junction between the resistor and the capacitor, and
         2) an output connected to the ESDD output.

4. The device of claim 1 wherein
   the CMOS Controlled Lateral SCR device comprises a NMOS Controlled Lateral SCR (NCLSCR), and
   the ESDD circuit includes a resistor and a capacitor having a junction therebetween connected in series between the power supply line and the ground line with the ESDD output line connected to the junction between the resistor and the capacitor.

5. An ESD protection circuit for an integrated circuit device comprising:
   a first power supply line VDD1 and a second power supply line VDD2,
   an electrostatic discharge detection (ESDD) circuit connected across the first power supply line VDD1 and the second power supply line VDD2 having an ESDD output,
   a single CMOS Controlled Lateral SCR (CLSCR) device having a gate electrode and a P+ region and an N+ region with the gate electrode connected to the ESDD output,
   a diode string comprising a plurality of diodes each having an anode and a cathode connected in series with a proximal diode and a distal diode,
   the P+ region of the single CLSCR connected to the first power supply line VDD1,
   the N+ region of the single CLSCR connected to the proximal diode, and
   the distal diode connected to a second power supply line VDD2, and
   a plurality of series connected diodes each having an anode and a cathode between the first power supply line and the second power supply line with the reverse polarity with respect to the diode string.

6. The device of claim 5 wherein the ESDD circuit includes a resistor and a capacitor having a junction therebetween connected in series between the first power supply line and the second power supply line with the ESDD output line connected to the junction between the resistor and the capacitor.

7. The device of claim 5 wherein:
   the CMOS Controlled Lateral SCR device comprises a PMOS Controlled Lateral SCR (PCLSCR), and
   the ESDD circuit includes a resistor and a capacitor having a junction therebetween connected in series between the first power supply line and the second power supply line with the ESDD output line connected to the junction between the resistor and the capacitor.

8. The device of claim 5 wherein:
   the CMOS Controlled Lateral SCR device comprises a NMOS Controlled Lateral SCR (NCLSCR), and the ESDD circuit includes a resistor and a capacitor having a junction therebetween connected in series between the first power supply line and the second power supply line with the ESDD output line connected to the junction between the resistor and the capacitor.

9. An ESD protection circuit for an integrated circuit device comprising:

a first power supply line VDD1 and a second power supply line VDD2 where voltage on the first power supply line is greater than voltage on the second power supply line, a single NMOS Controlled Lateral SCR (CLSCR) device having a gate electrode and a P+ region and an N+ region, a diode string comprising a plurality of diodes each having an anode and a cathode connected in series with a proximal diode and a distal diode, the P+ region of the single CLSCR connected to the first power supply line VDD1, the N+ region of the single CLSCR connected to the proximal diode, and the distal diode connected to the second power supply line VDD2, with the gate electrode connected to the anode of the proximal diode, a plurality of series connected diodes each having an anode and a cathode between the first power supply line and the second power supply line with the reverse polarity with respect to the diode string.

10. An ESD protection circuit for an integrated circuit device comprising:

a first power supply line VSS1 and a second power supply line VSS2, an electrostatic discharge detection (ESDD) circuit connected across the power supply line VSS1 and the second power supply line VSS2 having an ESDD output, a single PMOS Controlled Lateral SCR (PCLSCR) device having a gate electrode and a P+ region and an N+ region with the gate electrode connected to the ESDD output, a diode string comprising a plurality of diodes each having an anode and a cathode connected in series with a proximal diode and a distal diode, the P+ region of the single PCLSCR connected to the first power supply line VSS 1, the N+ region of the single PCLSCR connected to the proximal diode, and the distal diode connected to the second power supply line VSS2, and a plurality of series connected diodes each having an anode and a cathode between the first power supply line and the second power supply line with the reverse polarity with respect to the diode string.

11. The device of claim 10 wherein the ESDD circuit includes a resistor and a capacitor having a junction therebetween connected in series between the first power supply line and the second power supply line with the ESDD output line connected to the junction between the resistor and the capacitor.

12. The device of claim 10 wherein the ESDD circuit includes a resistor and a capacitor having a junction therebetween connected in series between the first power supply line and the second power supply line with the ESDD output line connected to the junction between the resistor and the capacitor, and the resistor connected to VSS1 and the capacitor connected to VSS2.

13. An ESD protection circuit for an integrated circuit device consisting of:

a power supply line and a ground line, an electrostatic discharge detection (ESDD) circuit connected across the power supply line VDD and the ground line VSS having an ESDD output line, a single NMOS Controlled Lateral SCR (NCLSCR) device having a gate electrode and a P+ region and an N+ region with the gate electrode connected to the ESDD output line, a diode string comprising a plurality of diodes each having an anode and a cathode connected in series with a proximal diode and a distal diode, the P+ region of the single NCLSCR connected to the power supply line VDD, the N+ region of the single NCLSCR connected to the proximal diode, and the distal diode connected to the ground line VSS.

14. An ESD-protection circuit for an integrated circuit device consisting of:

a power supply line and a ground line, an electrostatic discharge detection (ESDD) circuit connected across the power supply line VDD and the ground line VSS having an ESDD output line, a single PMOS Controlled Lateral SCR (PCLSCR) device having a gate electrode and a P+ region and an N+ region with the gate electrode connected to the ESDD output line, a diode string comprising a plurality of diodes each having an anode and a cathode connected in series with a proximal diode and a distal diode, the P+ region of the single PCLSCR connected to the power supply line VDD, the N+ region of the single PCLSCR connected to the proximal diode, and the distal diode connected to the ground line VSS.

15. An ESD protection circuit for an integrated circuit device consisting of:

an I/O signal line and a ground line, an electrostatic discharge detection (ESDD) circuit connected across the I/O signal line and the ground line, the I/O signal line and the ground line having an ESDD output line, a single NMOS Controlled Lateral SCR (NCLSCR) having a gate, a P+ region and an N+ region with the gate connected to the ESDD output line, a diode string comprising a plurality of diodes each having an anode and a cathode connected in series with a proximal diode and a distal diode, the P+ region of the single NCLSCR connected to the I/O signal line, the N+ region of the single NCLSCR connected to the proximal diode, and the distal diode connected to the ground line.

16. An ESD protection circuit for an integrated circuit device consisting of:

an I/O signal line and a ground line, an electrostatic discharge detection (ESDD) circuit connected across the I/O signal line and the ground line, the I/O signal line and the ground line having an ESDD output line, a single PMOS Controlled Lateral SCR (PCLSCR) having a gate, a P+ region and an N+ region with the gate connected to the ESDD output line, a diode string comprising a plurality of diodes each having an anode and a cathode connected in series with a proximal diode and a distal diode, the P+ region of the single PCLSCR connected to the I/O signal line, the N+ region of the single PCLSCR connected to the proximal diode, and the distal diode connected to the ground line.

* * * * *

UNITED STATES PATENT AND TRADEMARK OFFICE
CERTIFICATE OF CORRECTION

PATENT NO. : 6,671,153 B1
DATED : December 30, 2003
INVENTOR(S) : Ming-Dou Ker, Wen-Yu Lo and Hun-Hsien Chang It is certified that error appears in the above-identified patent and that said Letters Patent is hereby corrected as shown below:

Title page,
Item [75], delete "Wen-Yu Lo, Tung-Chih (TW)", and replace with -- Wen-Yu Lo, Tung Shih (TW) --, and delete "Hun-Hsien Chang, Hsichih (TW)", and replace with -- Hun-Hsien Chang, Taipei (TW) --.

Signed and Sealed this

Sixteenth Day of March, 2004

JON W. DUDAS
*Acting Director of the United States Patent and Trademark Office*